USO11437481B2

(12) United States Patent
Huang et al.

(10) Patent No.: US 11,437,481 B2
(45) Date of Patent: Sep. 6, 2022

(54) SEMICONDUCTOR DEVICE WITH T-SHAPED BURIED GATE ELECTRODE AND METHOD FOR FORMING THE SAME

(71) Applicant: NANYA TECHNOLOGY CORPORATION, New Taipei (TW)

(72) Inventors: Ching-Chia Huang, Taipei (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/916,696

(22) Filed: Jun. 30, 2020

(65) Prior Publication Data

US 2021/0408251 A1 Dec. 30, 2021

(51) Int. Cl.
*H01L 29/423* (2006.01)
*H01L 27/108* (2006.01)
*H01L 21/8234* (2006.01)
*H01L 27/088* (2006.01)

(52) U.S. Cl.
CPC .......... *H01L 29/4236* (2013.01); *H01L 21/823456* (2013.01); *H01L 27/088* (2013.01); *H01L 27/10823* (2013.01)

(58) Field of Classification Search
CPC ........... H01L 29/42356; H01L 29/4236; H01L 21/8234; H01L 21/823437; H01L 29/42372; H01L 29/42376; H01L 29/4238; H01L 21/823456; H01L 27/10823; H01L 27/10876; H01L 29/7856; H01L 21/28587; H01L 21/28593; H01L 21/28114; H01L 29/41
See application file for complete search history.

(56) References Cited

U.S. PATENT DOCUMENTS

| 6,033,959 | A | * | 3/2000 | Fu | ............... | H01L 21/28114 |
| | | | | | | 257/E21.205 |
| 2015/0243782 | A1 | * | 8/2015 | Pandey | ............ | H01L 29/7827 |
| | | | | | | 257/334 |
| 2019/0140096 | A1 | * | 5/2019 | Huang | .................. | H01L 29/78 |
| 2019/0172909 | A1 | * | 6/2019 | Tsai | .................... | H01L 29/7835 |
| 2019/0173469 | A1 | * | 6/2019 | Lin | ................ | H01L 21/28114 |
| 2019/0198502 | A1 | * | 6/2019 | Huang | ........... | H01L 27/10823 |
| 2020/0168611 | A1 | * | 5/2020 | Jeon | ................ | H01L 21/28114 |

* cited by examiner

*Primary Examiner* — Nelson Garces
*Assistant Examiner* — William Henry Anderson
(74) *Attorney, Agent, or Firm* — Muncy, Geissler, Olds & Lowe, P.C.

(57) ABSTRACT

The present disclosure provides a semiconductor device with a T-shaped buried gate electrode and a method for forming the semiconductor device. The semiconductor device includes a semiconductor substrate having an active region, and a first gate electrode disposed in the semiconductor substrate. The semiconductor device also includes a first source/drain region and a second source/drain region disposed in the active region and at opposite sides of the first gate electrode. The first gate electrode has a first portion extending across the active region and a second portion extending into the first source/drain region.

7 Claims, 20 Drawing Sheets

SEMICONDUCTOR DEVICE WITH T-SHAPED BURIED GATE ELECTRODE AND METHOD FOR FORMING THE SAME

TECHNICAL FIELD

The present disclosure relates to a semiconductor device and a method for forming the same, and more particularly, to a semiconductor device with a T-shaped buried gate electrode and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. A dynamic random access memory (DRAM) including many memory cells is one of the most popular volatile semiconductor memory devices utilized today. Each memory cell includes a transistor and a capacitor, wherein the transistor and the capacitor form a series connection with each other. The memory cells are arranged into memory arrays. The memory cells are addressed via a word line and a bit line, one of which addresses a column of memory cells while the other addresses a row of memory cells. By using the word line and the bit line, a DRAM cell can be read and programmed.

Moreover, as semiconductor fabrication technology continues to improve, sizes of semiconductor devices are reduced, and the sizes of memory cells decreases correspondingly. Accordingly, gate control ability for such memory cells becomes a serious issue in a memory device.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a semiconductor substrate having an active region, and a first gate electrode disposed in the semiconductor substrate. The semiconductor device also includes a first source/drain region and a second source/drain region disposed in the active region and at opposite sides of the first gate electrode. The first gate electrode has a first portion extending across the active region and a second portion extending into the first source/drain region.

In an embodiment, the second portion of the first gate electrode is within the active region. In an embodiment, the first portion and the second portion of the first gate electrode form a right angle. In an embodiment, the first source/drain region surrounds three sides of the second portion of the first gate electrode. In an embodiment, the semiconductor device further includes a second gate electrode disposed in the semiconductor substrate, and a third source/drain region disposed in the active region, wherein the second source/drain region and the third source/drain region are disposed at opposite sides of the second gate electrode, and wherein the second gate electrode has a third portion extending across the active region and a fourth portion extending into the third source/drain region.

In an embodiment, the second source/drain region is between the first gate electrode and the second gate electrode, and the second portion of the first gate electrode and the fourth portion of the second gate electrode extend parallel to each other. In an embodiment, the fourth portion of the second gate electrode is within the active region, and the third source/drain region surrounds three sides of the fourth portion of the second gate electrode. In an embodiment, the semiconductor device further includes a bit line structure disposed over the semiconductor substrate, wherein the bit line structure is electrically connected to the second source/drain region.

In another embodiment of the present disclosure, a semiconductor device is provided. The semiconductor device includes an isolation structure disposed in a semiconductor substrate. The semiconductor device also includes a first source/drain region, a second source/drain region, and a third source/drain region disposed in an active region defined by the isolation structure. The semiconductor device further includes a first gate electrode disposed in the semiconductor substrate and between the first source/drain region and the second source/drain region. The first gate electrode has a first portion extending across the active region and a second portion protruding from the first portion. In addition, the semiconductor device includes a second gate electrode disposed in the semiconductor substrate and between the second source/drain region and the third source/drain region. The second gate electrode has a third portion extending across the active region and a fourth portion protruding from the third portion.

In an embodiment, the first portion of the first gate electrode is parallel to the third portion of the second gate electrode, and the second portion of the first gate electrode and the fourth portion of the second gate electrode extend in opposite directions. In an embodiment, the second portion of the first gate electrode extends into the first source/drain region, the fourth portion of the second gate electrode extends into the third source/drain region, and the second portion and the fourth portion are within the active region. In an embodiment, the first portion and the second portion of the first gate electrode form a first T-shaped structure in a top view, and the third portion and the fourth portion of the second gate electrode form a second T-shaped structure in the top view, and wherein the first T-shaped structure and the second T-shaped structure are mirror images across a central line of the active region.

In an embodiment, the first portion of the first gate electrode has a first length along a direction from the first source/drain region to the second source/drain region, the second portion of the first gate electrode has a second length along the direction from the first source/drain region to the second source/drain region, and a ratio of the second length to the first length is in a range from about 0.5 to about 1. In an embodiment, the semiconductor device further includes a third gate electrode and a fourth gate electrode disposed in the semiconductor substrate and over the isolation structure, wherein the third gate electrode, the fourth gate electrode, the first portion of the first gate electrode and the third portion of the second gate electrode are parallel to each other, and wherein the first source/drain region is between the third gate electrode and the first gate electrode, and the third source/drain region is between the fourth gate electrode and the second gate electrode. In an embodiment, the second portion of the first gate electrode is closer to the third gate electrode than the first portion of the first gate electrode, and the fourth portion of the second gate electrode is closer to the fourth gate electrode than the third portion of the second gate electrode.

In yet another embodiment of the present disclosure, a method for forming a semiconductor device is provided. The method includes forming an isolation structure in a semiconductor substrate to define an active region, and forming a doped region in the active region. The method also includes etching the semiconductor substrate to form a first trench and a second trench. The first trench has a first portion extending across the doped region and a second portion extending away from the first portion, and the second trench has a third portion extending across the doped region and a fourth portion extending away from the third portion. The method further includes forming a first gate electrode in the first trench and a second gate electrode in the second trench.

In an embodiment, the second portion of the first trench and the fourth portion of the second trench extend in opposite directions. In an embodiment, an extreme ultraviolet (EUV) lithography process is utilized to form the first trench and the second trench. In an embodiment, the first portion of the first trench and the third portion of the second trench penetrate through the doped region to form a first source/drain region, a second source/drain region, and a third source/drain region, and the second source/drain region is between the first trench and the second trench, and wherein the second portion of the first trench extends into the first source/drain region, and the fourth portion of the second trench extends into the third source/drain region. In an embodiment, the second portion of the first trench exposes three sides of the first source/drain region, and the fourth portion of the second trench exposes three sides of the third source/drain region.

Embodiments of a semiconductor device are provided in the disclosure. The semiconductor device includes a gate electrode disposed in a semiconductor substrate. The semiconductor device also includes source/drain regions disposed in an active region of the semiconductor substrate and at opposite sides of the gate electrode. The gate electrode includes a portion extending across the active region and another portion extending into the one of the source/drain regions. Therefore, the effective gate width (i.e., effective channel width) may be increased so that a rise in saturation current may be obtained. As a result, the gate control ability may be improved, and the operation speed of the device may be increased, which significantly improves the overall device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
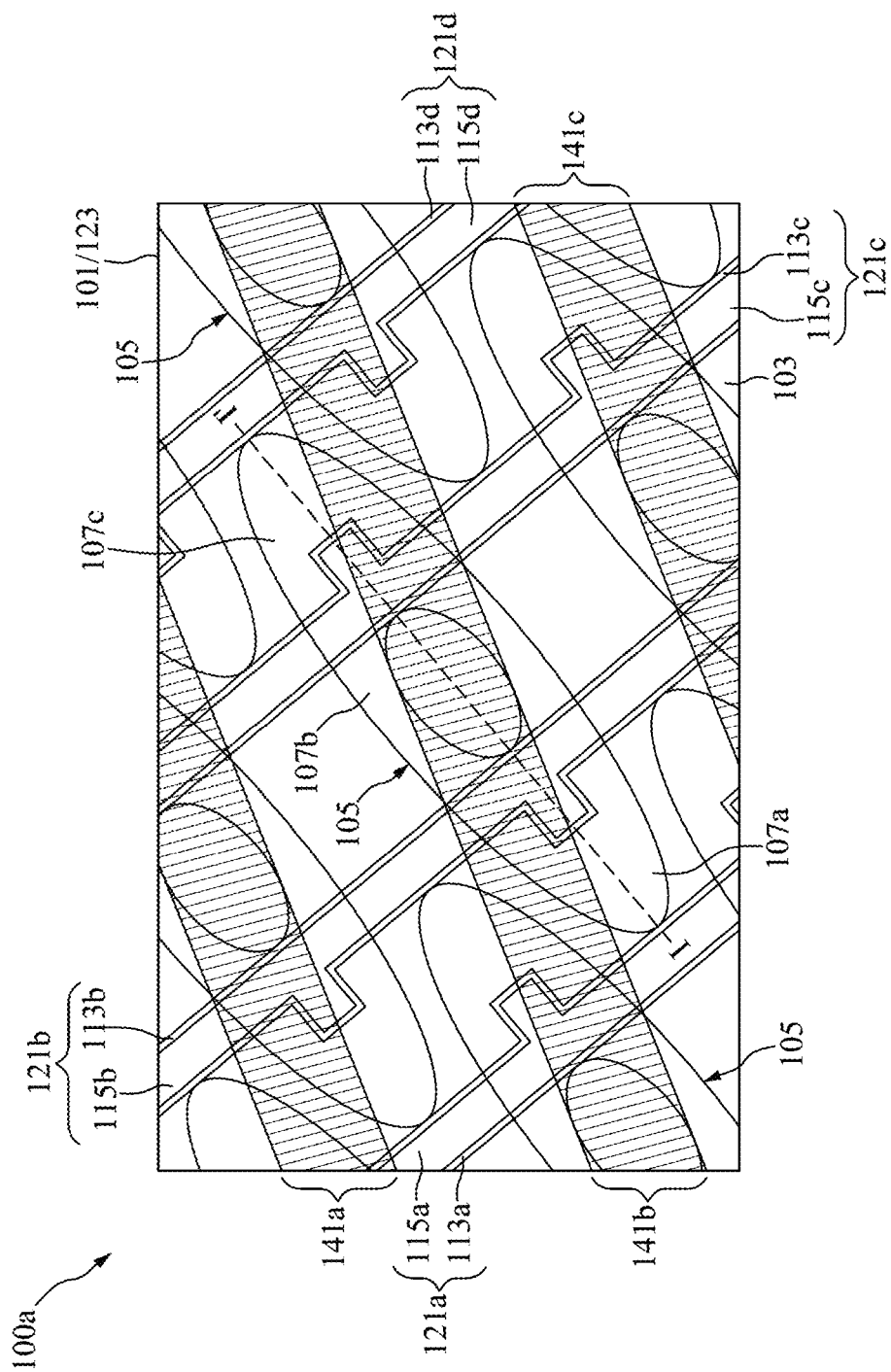
FIG. 1 is a top view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in is the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
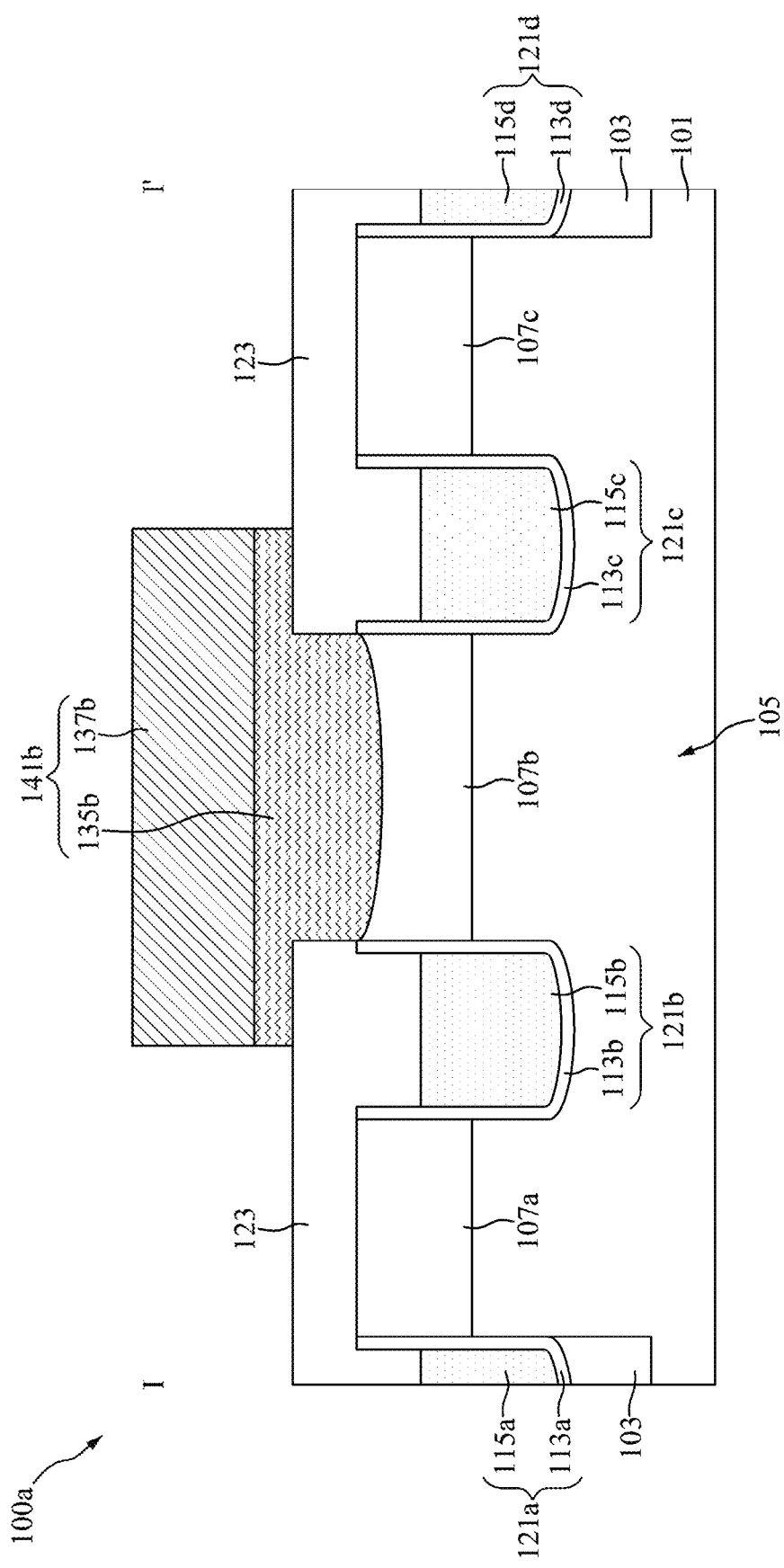
FIG. 2 is a cross-sectional view illustrating the semiconductor device along the sectional line I-I' in FIG. 1, in accordance with some embodiments.

FIG. 1 is a top view illustrating a semiconductor device 100a, and FIG. 2 is a cross-sectional view illustrating the semiconductor device 100a along the sectional line I-I' in FIG. 1, in accordance with some embodiments. As shown in FIGS. 1 and 2, the semiconductor device 100a includes a plurality of active regions 105, a plurality of gate structures 121a, 121b, 121c, and 121d, and a plurality of bit lines structures 141a, 141b, and 141c.

In some embodiments, the active regions 105 are defined by an isolation structure 103 disposed in a semiconductor substrate 101, and the gate structures 121a, 121b, 121c, and 121d are buried in the semiconductor substrate 101. In the present embodiment, the semiconductor device 100a is a dynamic random access memory (DRAM), and the buried gate structures 121a, 121b, 121c, and 121d serve as buried word lines for the DRAM. Although only four word lines are illustrated, it is understood that more than four word lines may be implemented in the semiconductor device 100a.

Moreover, in some embodiments, each of the active regions 105 is intersected by two adjacent gate structures and each of the active regions 105 has three source/drain regions separated by the two adjacent gate structures. For example, source/drain regions 107a, 107b, and 107c are disposed in one of the active regions 105. The source/drain regions 107a and 107b are located at two opposite sides of the gate structure 121b, and the source/drain regions 107b and 107c are located at two opposite sides of the gate structure 121c, as shown in FIGS. 1-2 in accordance with some embodiments. In addition, the source/drain region 107b is located between the gate structures 121b and 121c, and the source/drain region 107b serves as a common source/drain region which is electrically connected to the bit line structure 141b.

Each of the gate structures 121a, 121b, 121c, and 121d includes a gate dielectric layer and a gate electrode. For example, the gate structure 121a is composed of a gate dielectric layer 113a and a gate electrode 115a surrounded by the gate dielectric layer 113a, and the gate structure 121b is composed of a gate dielectric layer 113b and a gate electrode 115b surrounded by the gate dielectric layer 113b. Similarly, the gate structure 121c is composed of a gate dielectric layer 113c and a gate electrode 115c surrounded by the gate dielectric layer 113c, and the gate structure 121d is composed of a gate dielectric layer 113d and a gate electrode 115d surrounded by the gate dielectric layer 113d. In some embodiments, the gate electrodes 115a, 115b, 115c, and 115d are separated from the semiconductor substrate 101 by the gate dielectric layers 113a, 113b, 113c, and 113d, respectively.

It should be noted that the gate structures 121a, 121b, 121c, and 121d have "T" shape structures in the top view of FIG. 1, in accordance with some embodiments. Specifically, in some embodiments, the gate electrodes 115a, 115b, 115c, and 115d of the gate structures 121a, 121b, 121c, and 121d have "T" shape structures in the top view of FIG. 1. The details will be described later. In addition, the gate structures 121a, 121b, 121c, and 121d are covered by a dielectric cap layer 123, which is configured to protect and isolate the gate electrodes 115a, 115b, 115c, and 115d from the conductive features disposed above.

Still referring to FIGS. 1 and 2, the semiconductor device 100a also includes the bit line structures 141a, 141b, and 141c. As shown in FIG. 2, the bit line structure 141b is electrically connected to the source/drain region 107b between the gate structures 121b and 121c, in accordance with some embodiments. Although only three bit line structures are illustrated in the top view of FIG. 1, it is understood that more than three bit line structures may be implemented in the semiconductor device 100a. In the present embodiment, the semiconductor device 100a is a DRAM, and the source/drain regions 107a and 107c are electrically connected to respective capacitors (not shown).

Figure 3:
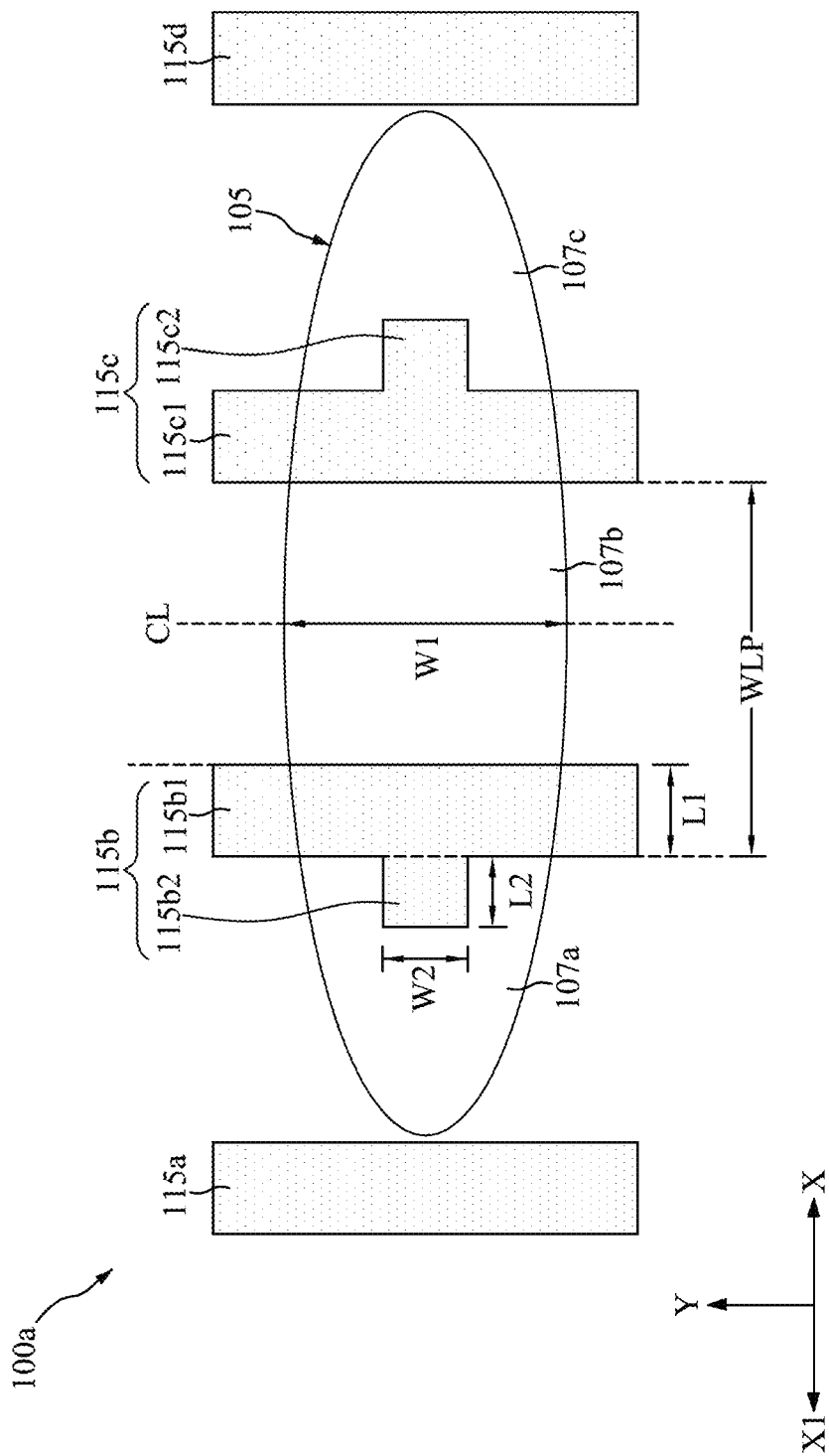
FIG. 3 is a schematic top view illustrating a portion of a semiconductor device, in accordance with some embodiments.

FIG. 3 is a schematic top view illustrating a portion of the semiconductor device 100a, in accordance with some embodiments. It should be noted that some of the features, such as the gate dielectric layers 113a, 113b, 113c, and 113d, and the bit line structures 141a, 141b, and 141c, are omitted from FIG. 3 in order to clarify the sizes, the profiles and the locations of the gate electrodes 115a, 115b, 115c, and 115d.

As shown in FIG. 3, the source/drain region 107a is between the gate electrodes 115a and 115b, the source/drain region 107b is between the gate electrodes 115b and 115c, and the source/drain region 107c is between the gate electrodes 115c and 155d. In some embodiments, the gate electrode 115b includes a portion 115b1 extending across the active region 105 and a portion 115b2 protruding (extending away) from the portion 115b1, and the gate electrode 115c includes a portion 115c1 extending across the active region 105 and a portion 115c2 protruding (extending away) from the portion 115c. Although the gate electrodes 115a and 115d do not include any protruding portions in the top view of FIG. 3, the gate electrodes 115a and 115d may include protruding portions within other active regions 105, as shown in the top view of FIG. 1.

In some embodiments, the portion 115b2 of the gate electrode 115b is closer to the gate electrode 115a than the portion 115b1 of the gate electrode 115b, and the portion 115c2 of the gate electrode 115c is closer to the gate electrode 115d than the portion 115c1 of the gate electrode 115c. In some embodiments, the portion 115b2 of the gate electrode 115b extends into the source/drain region 107a, and the portion 115c2 of the gate electrode 115c extends into the source/drain region 107c.

As shown in FIG. 3, the X1-direction is opposite to the X-direction, and the Y-direction is perpendicular to the X-direction and the X1-direction. In some embodiments, the portion 115b2 of the gate electrode 115b and the portion 115c2 of the gate electrode 115c extend parallel to each other but in opposite directions. In particular, the gate electrode 115a, the portion 115b1 of the gate electrode 115b, the portion 115c1 of the gate electrode 115c, and the gate electrode 115d extend along the Y-direction, the portion 115b2 of the gate electrode 115b extends along the X1 direction, and the portion 115c2 of the gate electrode 115c extends along the X-direction, in accordance with some embodiments. That is, the portions 115b1 and 115b2 of the gate electrode 115b form a right angle, and the portions 115c1 and 115c2 of the gate electrode 115c form a right angle.

In some embodiments, the portion 115b2 of the gate electrode 115b and the portion 115c2 of the gate electrode 115c are within the same active region 105. In some embodiments, the portion 115b2 of the gate electrode 115b and the portion 115c2 of the gate electrode 115c do not extend to the isolation structure 103 outside of the active region 105. Furthermore, the portion 115b2 of the gate electrode 115b and the portion 115c2 of the gate electrode 115c are separated from the gate electrodes 115a and 115d.

In particular, the source/drain region 107a surrounds three sides of the portion 115b2 of the gate electrode 115b, and the source/drain region 107c surrounds three sides of the portion 115c2 of the gate electrode 115c, in accordance with some embodiments. In some embodiments, the portions 115b1 and 115b2 of the gate electrode 115b form a T-shaped structure, and the portions 115c1 and 115c2 of the gate electrode 115c form another T-shaped structure in the schematic top view of FIG. 3. It should be noted that the two T-shaped structures are mirror images across the central line CL of the active region 105.

Still referring to FIG. 3, the active region 105 has a maximum width W1 along the Y-direction, and the portion 115b2 has a width W2 along the Y-direction. In some embodiments, the ratio (W2/W1) of the width W2 to the maximum width W1 is greater than 0 and smaller than about 0.5. The portion 115b1 has a length L1 along the X-direction (or the X1-direction), and the portion 115b2 has a length L2 along the X-direction (or the X1-direction). The length L2 is less than a word line pitch WLP of the semiconductor device 100a. In some embodiments, the ratio (L2/L1) of the length L2 to the length L1 is in a range from about 0.5 to about 1. The portion 115c2 of the gate electrode 115c has similar features as the above-mentioned features of the portion 115b2 of the gate electrode 115b, and details thereof are not repeated herein.

Since the gate electrodes 115b and 115c of the semiconductor device 100a have the portions 115b2 and 115c2 protruding from the portions 115b1 and 115c1, respectively, the effective gate width (i.e., effective channel width) may be increased, and the saturation current may be increased. Thus, the gate control ability may be improved, and the operation speed of the semiconductor device 100a may be increased. In particular, the charging and discharging rates of the transistors (e.g., the transistor composed of the gate electrode 115b and the source/drain regions 107a and 107b, and the transistor composed of the gate electrode 115c and the source/drain regions 107b and 107c) may be increased, and the write speeds of the capacitors coupled to the transistors may be improved, which significantly improves the overall device performance.

Figure 4:
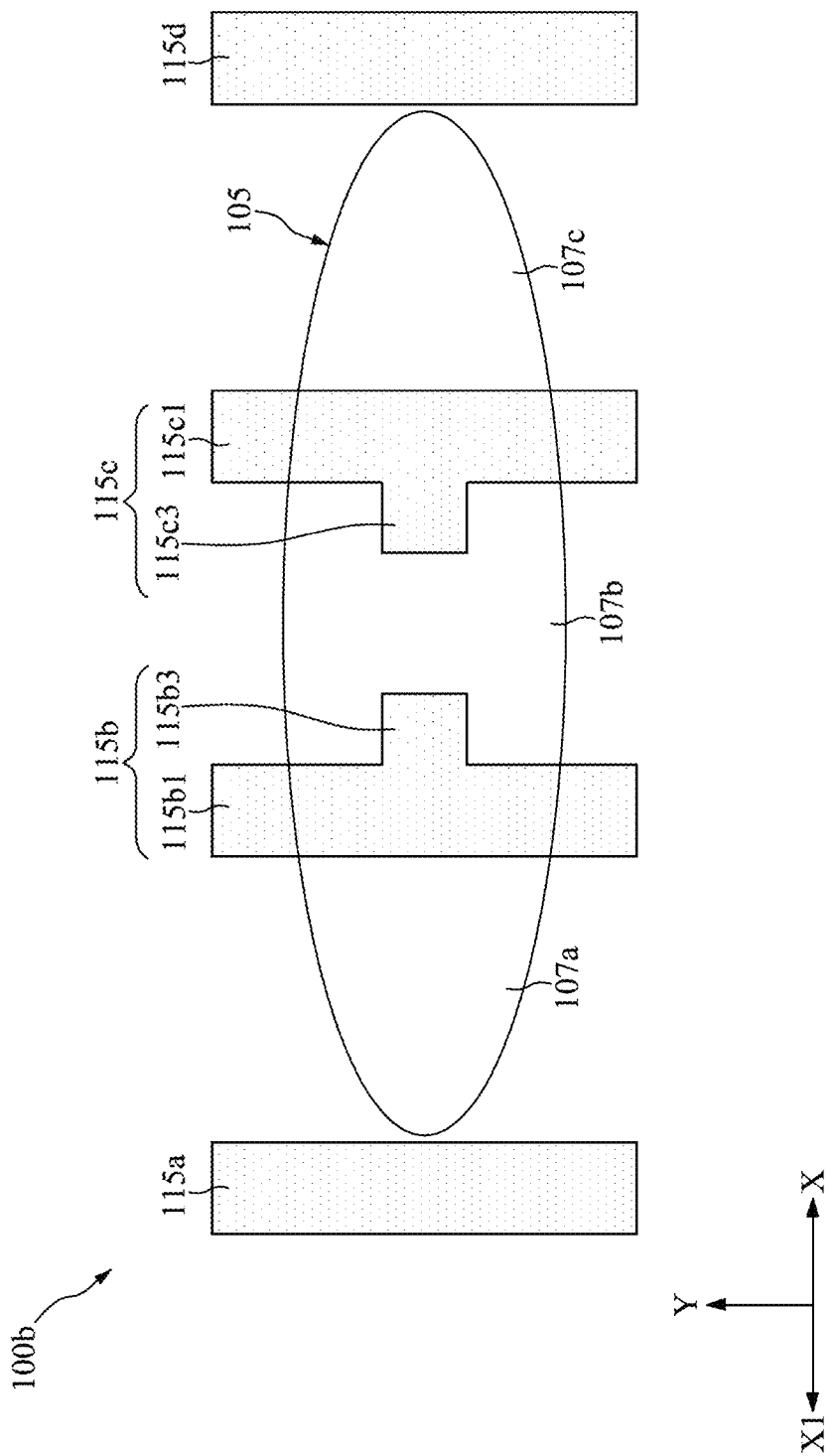
FIG. 4 is a schematic top view illustrating a portion of a modified semiconductor device, in accordance with some embodiments.

FIG. 4 is a schematic top view illustrating a portion of a semiconductor device 100b, which is an alternative embodiment of the semiconductor device 100a, in accordance with some embodiments. For reasons of consistency and clarity, similar components appearing in both FIGS. 3 and 4 will be labeled the same. In this alternative embodiment, the semiconductor device 100b includes, instead of the portions 115b2 and 115c2, a portion 115b3 protruding (extending away) from the portion 115b1 and a portion 115c3 protruding (extending away) from the portion 115c1. It should be noted that the locations of the portions 115b3 and 115c3 of the gate electrodes 115b and 115c in the semiconductor device 100b are different from the locations of the portions 115b2 and 115c2 of the gate electrodes 115b and 115c in the semiconductor device 100a.

In the semiconductor device 100b, the portion 115b3 of the gate electrode 115b and the portion 115c3 of the gate electrode 115c extend into the same source/drain region 107b. In some embodiments, the portion 115b3 of the gate electrode 115b and the portion 115c3 of the gate electrode 115c extend parallel to each other but in opposite directions. Specifically, the portion 115b3 of the gate electrode 115b extends along the X direction, and the portion 115c3 of the gate electrode 115c extends along the X1-direction, in accordance with some embodiments.

It should be noted that the portion 115b3 of the gate electrode 115b and the portion 115c3 of the gate electrode 115c are within the same active region 105, and the portion 115b3 of the gate electrode 115b is separated from the portion 115c3 of the gate electrode 115c. In particular, the source/drain region 107b surrounds three sides of the portion 115b3 of the gate electrode 115b and three sides of the portion 115c3 of the gate electrode 115c, and a portion of the source/drain region 107b is between the portion 115b3 of the gate electrode 115b and the portion 115c3 of the gate electrode 115c.

Figure 5:
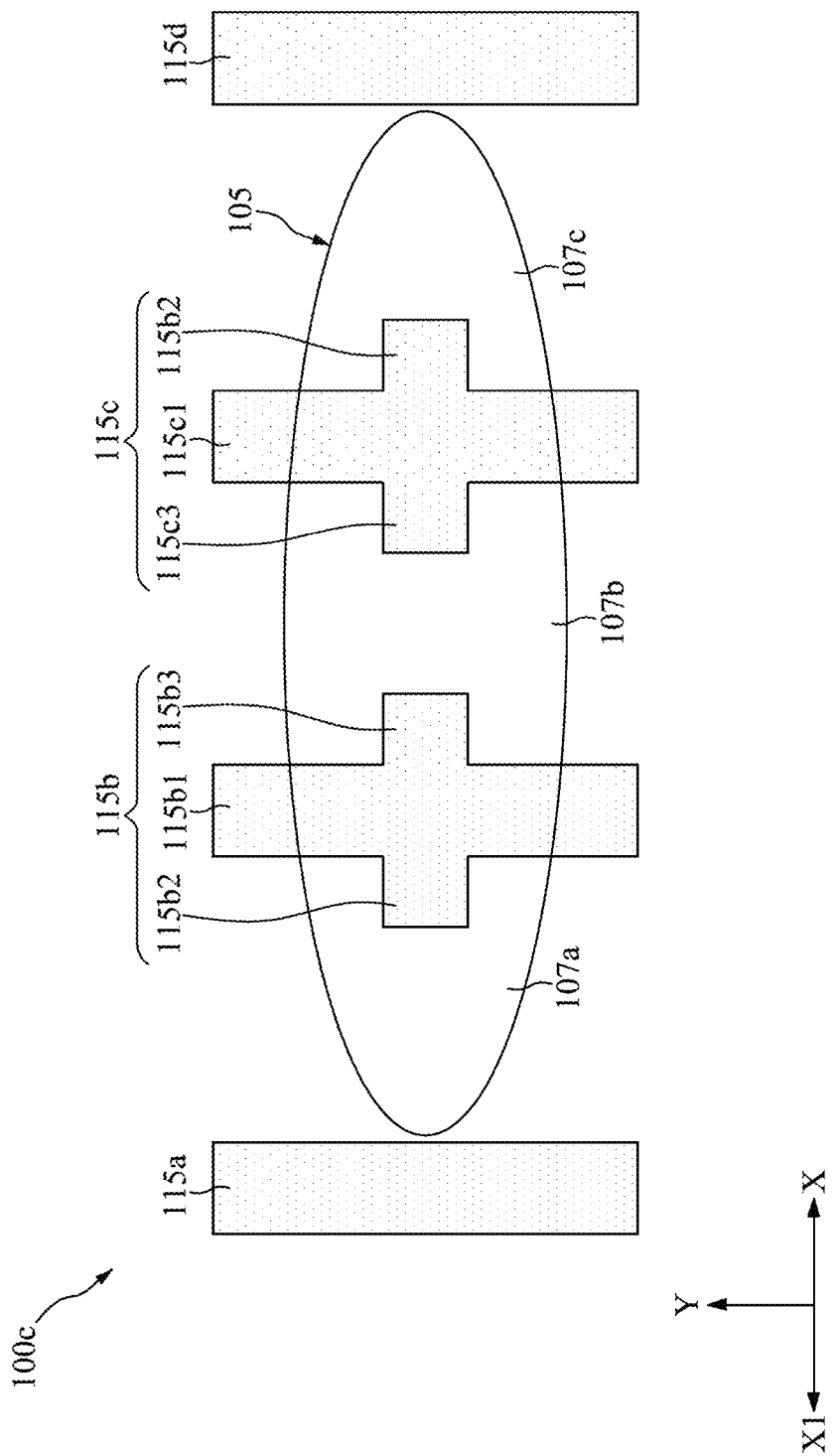
FIG. 5 is a schematic top view illustrating a portion of a modified semiconductor device, in accordance with some embodiments.

FIG. 5 is a schematic top view illustrating a portion of a semiconductor device 100c, which is an alternative embodiment of the semiconductor device 100a, in accordance with some embodiments. For reasons of consistency and clarity, similar components appearing in both FIGS. 3 and 5 will be labeled the same.

Compared with the gate electrodes 115b and 115c of the semiconductor devices 100a and 100b, the gate electrode 115b of the semiconductor device 100c includes portions 115b2 and 115b3 protruding (extending away) from opposite sides of the portion 115b1, and the gate electrode 115c of the semiconductor device 100c includes portions 115c2 and 115c3 protruding (extending away) from opposite sides of the portion 115c1. The locations of the portions 115b2 and 115c2 of the semiconductor device 100c are similar to the locations of the portions 115b2 and 115c2 shown in the semiconductor device 100a, and the locations of the portions 115b3 and 115c3 of the semiconductor device 100c are similar to the locations of the portions 115b3 and 115c3 shown in the semiconductor device 100b.

Figure 6:
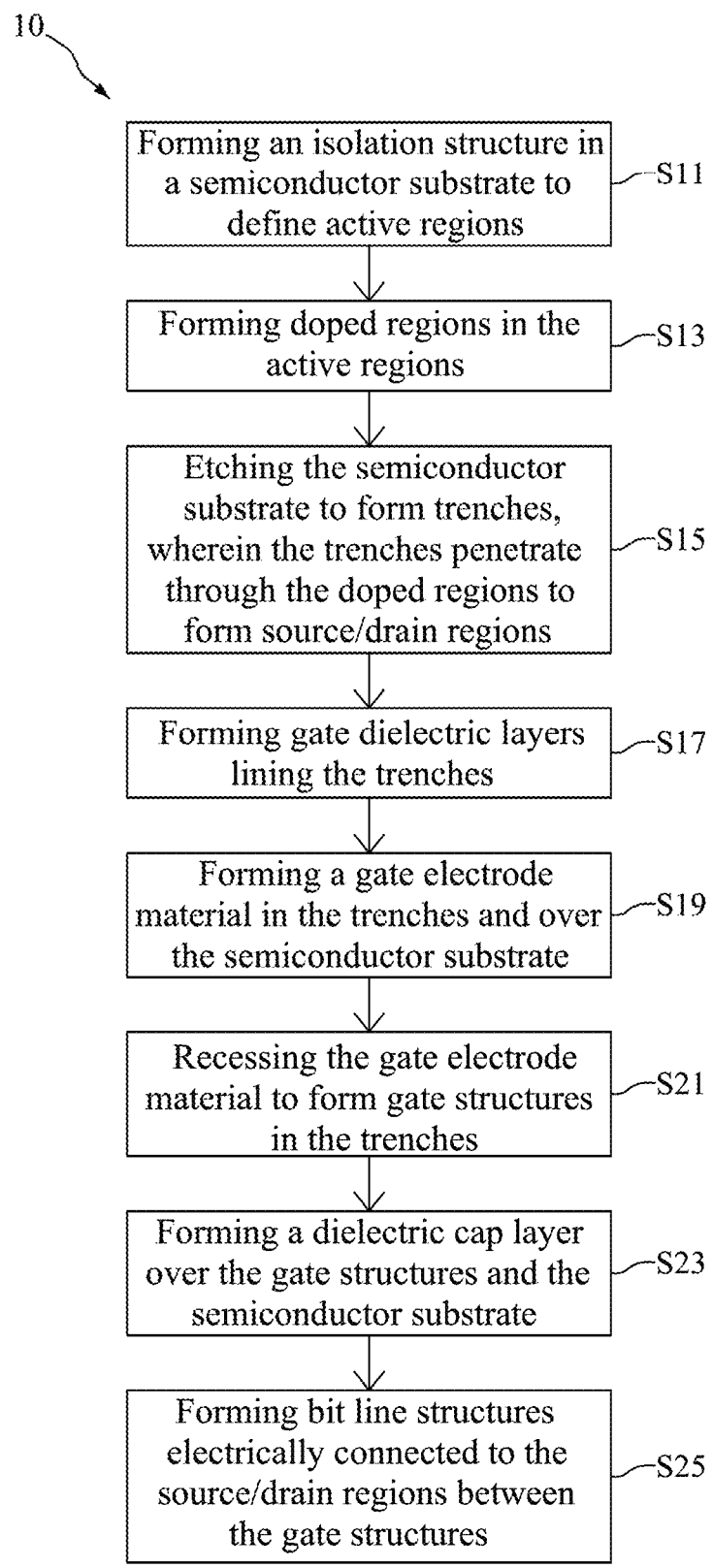
FIG. 6 is a flow diagram illustrating a method of forming a semiconductor device, in accordance with some embodiments.

FIG. 6 is a flow diagram illustrating a method 10 of forming the semiconductor device 100a, 100b, or 100c, and the method 10 includes steps S11, S13, S15, S17, S19, S21, S23 and S25, in accordance with some embodiments. The steps S11 to S25 of FIG. 6 are elaborated in connection with the following figures.

FIGS. 7, 9, 11, 13, 15, 17 and 19 are top views illustrating intermediate stages in the formation of the semiconductor device 100a, and FIGS. 8, 10, 12, 14, 16, 18 and 20 are cross-sectional views illustrating intermediate stages in the formation of the semiconductor device 100a, in accordance with some embodiments. It should be noted that FIGS. 8, 10, 12, 14, 16, 18 and 20 are cross-sectional views along the sectional line I-I' of FIGS. 7, 9, 11, 13, 15, 17 and 19, respectively.

Figure 7:
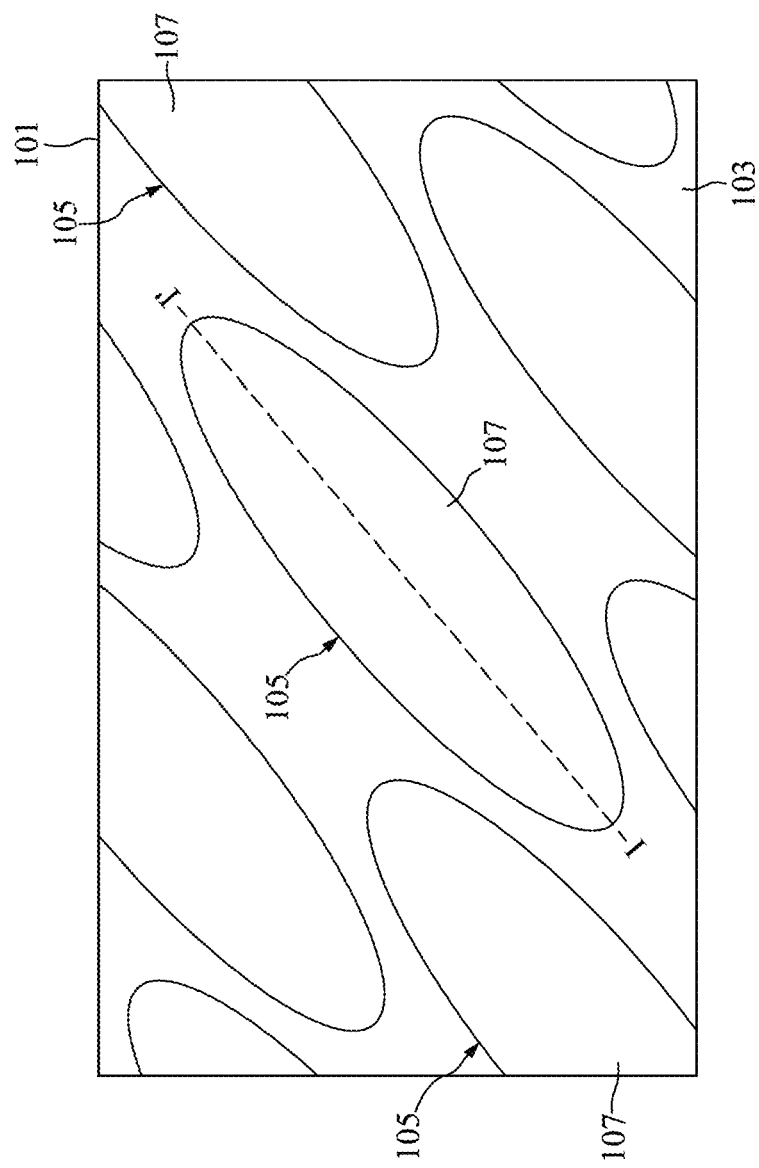
FIG. 7 is a top view illustrating an intermediate stage of forming an isolation structure to define active regions during the formation of the semiconductor device, in accordance with some embodiments.
Figure 8:
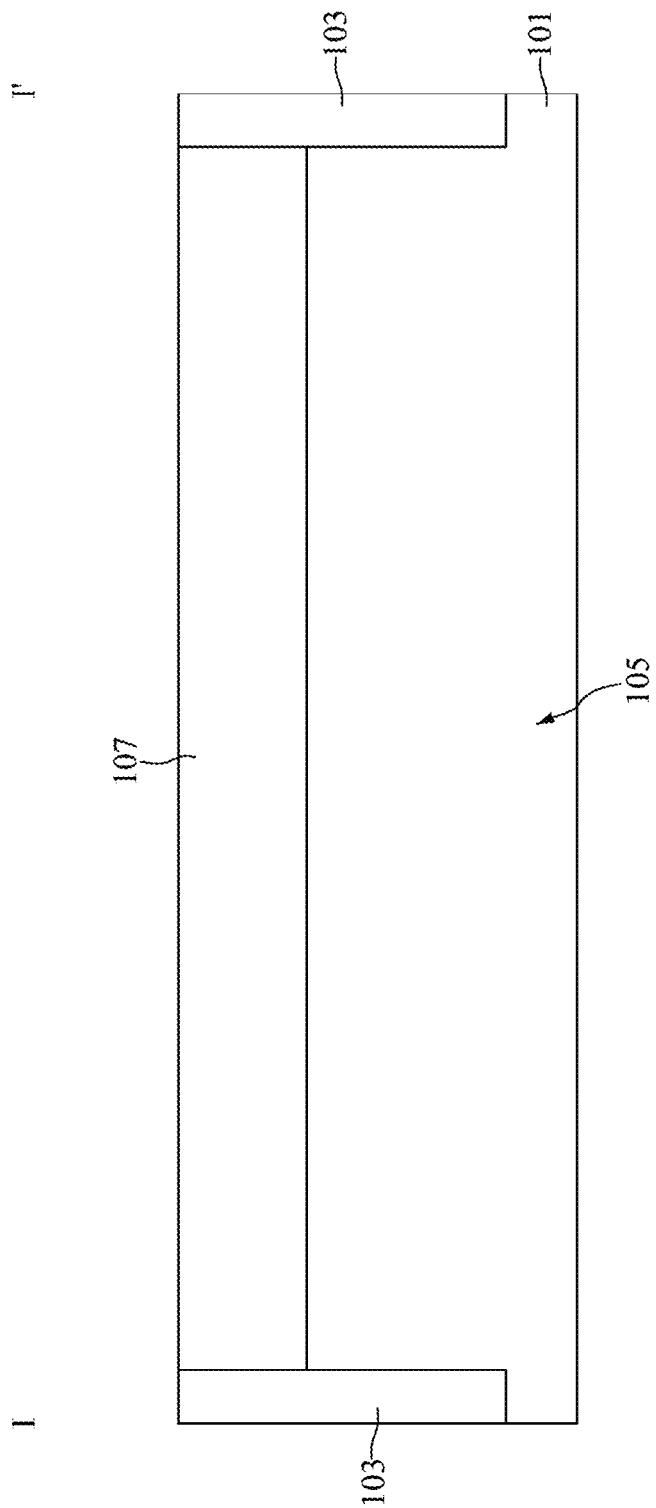
FIG. 8 is a cross-sectional view illustrating an intermediate stage of forming an isolation structure to define active regions during the formation of the semiconductor device along the sectional line I-I' in FIG. 7, in accordance with some embodiments.

As shown in FIGS. 7 and 8, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIGS. 7 and 8, the isolation structure 103 is formed in the semiconductor substrate 101 to define the active regions 105, and the isolation structure 103 is a shallow trench isolation (STI) structure, in accordance with some embodiments. The respective step is illustrated as the step S11 in the method 10 shown in FIG. 6. In addition, the isolation structure 103 may be made of silicon oxide, silicon nitride, silicon oxynitride or another applicable dielectric material, and the formation of the isolation structure 103 may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and polishing the dielectric material until the semiconductor substrate 101 is exposed.

Moreover, doped regions 107 are formed in the active regions 105 defined by the isolation structure 103. The respective step is illustrated as the step S13 in the method 10 shown in FIG. 6. In some embodiments, the doped regions 107 are formed by one or more ion implantation processes, and P-type dopants, such as boron (B), gallium (Ga), or indium (In), or N-type dopants, such as phosphorous (P) or arsenic (As), can be implanted in the active regions 105 to form the doped regions 107, depending on the conductivity type of the semiconductor device 100a. In addition, the doped regions 107 will become the source/drain regions of the semiconductor device 100a in the subsequent processes.

Figure 9:
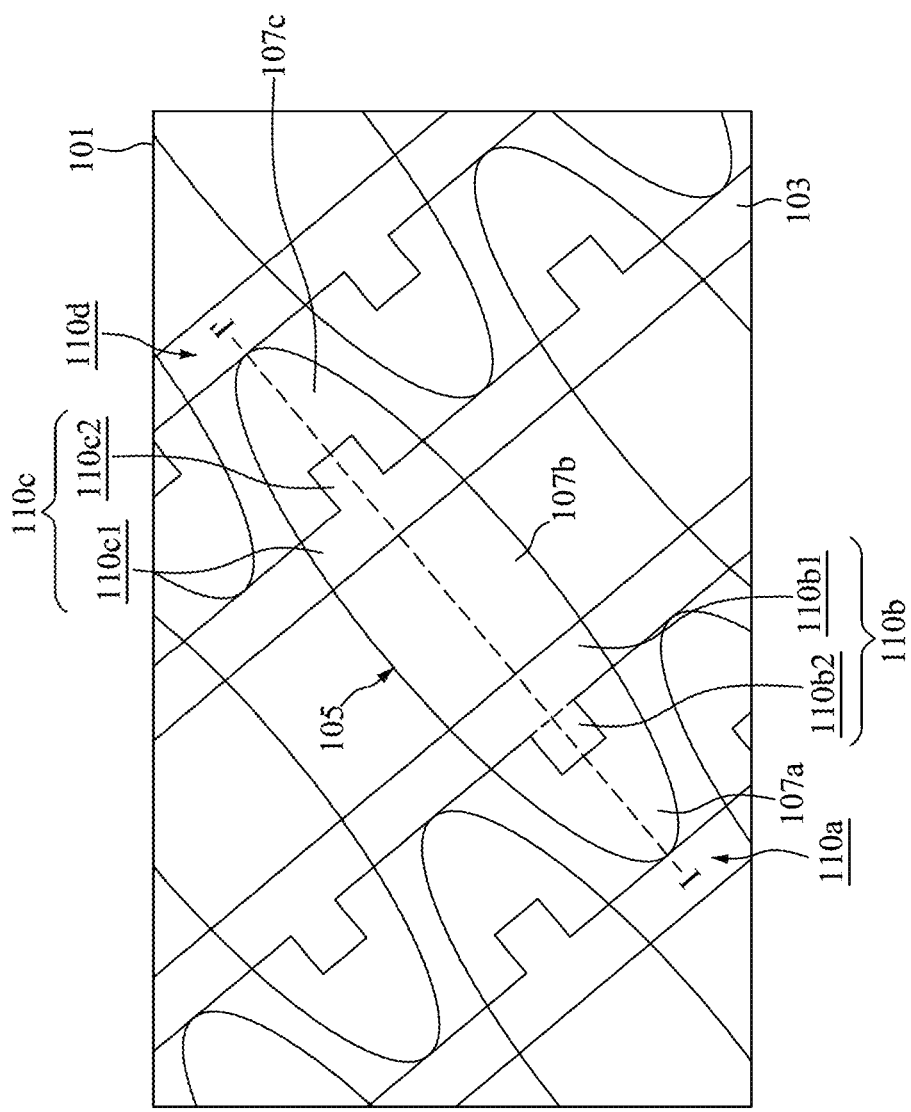
FIG. 9 is a top view illustrating an intermediate stage of forming trenches in a semiconductor substrate during the formation of the semiconductor device, in accordance with some embodiments.
Figure 10:
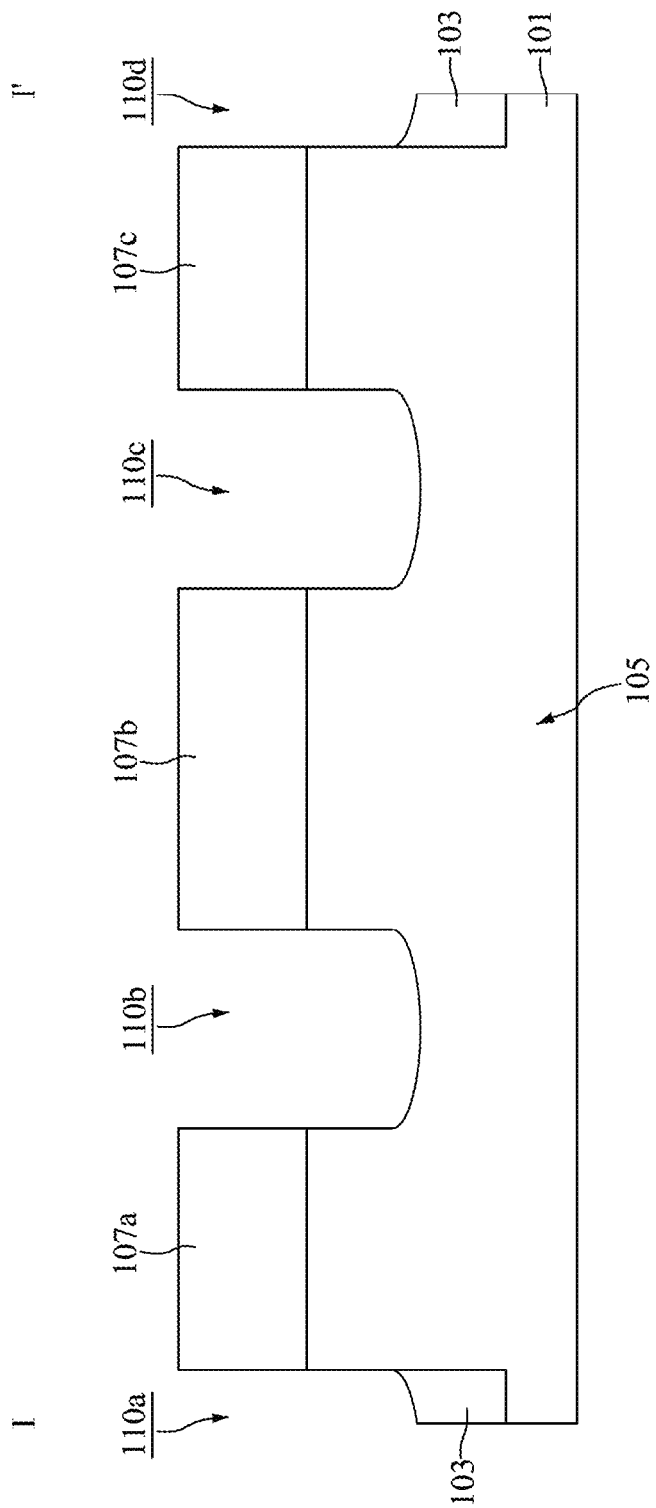
FIG. 10 is a cross-sectional view illustrating an intermediate stage of forming trenches in a semiconductor substrate during the formation of the semiconductor device along the sectional line I-I' in FIG. 9, in accordance with some embodiments.

After the doped regions 107 are formed, the semiconductor substrate 101 is etched to form trenches 110a, 110b, 110c, and 110d, as shown in FIGS. 9 and 10 in accordance with some embodiments. The respective step is illustrated as the step S15 in the method 10 shown in FIG. 6. As shown in FIG. 10, the trenches 110a and 110d expose the isolation structure 103, and the trenches 110b and 110c penetrate through the doped regions 107 to form source/drain regions 107a, 107b, and 107c. In some embodiments, the source/drain region 107a is between the trenches 110a and 110b, the source/drain region 107b is between the trenches 110b and 110c, and the source/drain region 107c is between the trenches 110c and 110d.

It should be noted that the trench 110b includes a portion 110b1 extending across the active region 105 and a portion 110b2 protruding (extending away) from the portion 110b1, and the trench 110c includes a portion 110c1 extending across the active region 105 and a portion 110c2 protruding (extending away) from the portion 110c1. In some embodiments, the portion 110b2 of the trench 110b extends into the source/drain region 107a, and the portion 110c2 of the trench 110c extends into the source/drain region 107c.

Moreover, the portion 110b2 of the trench 110b and the portion 110c2 of the trench 110c extend parallel to each other but in opposite directions. In some embodiments, the portions 110b2 and 110c2 are within the same active region 105. In particular, the portion 110b2 of the trench 110b exposes three sides of the source/drain region 107a, and the portion 110c2 of the trench 110c exposes three sides of the source/drain region 107c, in accordance with some embodiments.

The formation of the trenches 110a, 110b, 110c, and 100d may include forming a patterned mask (not shown) over the semiconductor substrate 101, and etching the semiconductor substrate 101 by using the patterned mask as a mask. In some embodiments, to achieve a high fidelity pattern transfer from the patterned mask to the semiconductor substrate 101, an extreme ultraviolet (EUV) lithography process is utilized to form the trenches 110a, 110b, 110c, and 100d. After the trenches 110a, 110b, 110c, and 100d are formed, the pattered mask may be removed.

Figure 11:
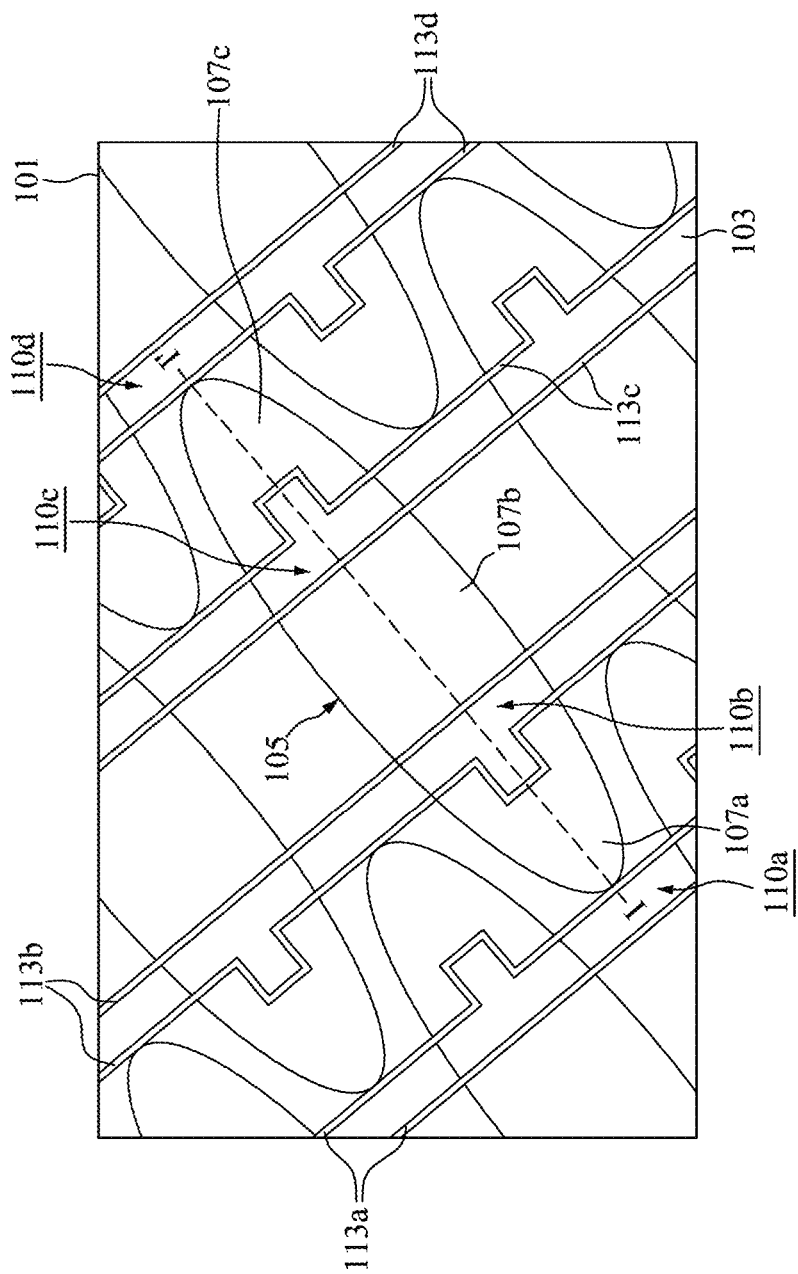
FIG. 11 is a top view illustrating an intermediate stage of forming gate dielectric layers lining the trenches during the formation of the semiconductor device, in accordance with some embodiments.
Figure 12:
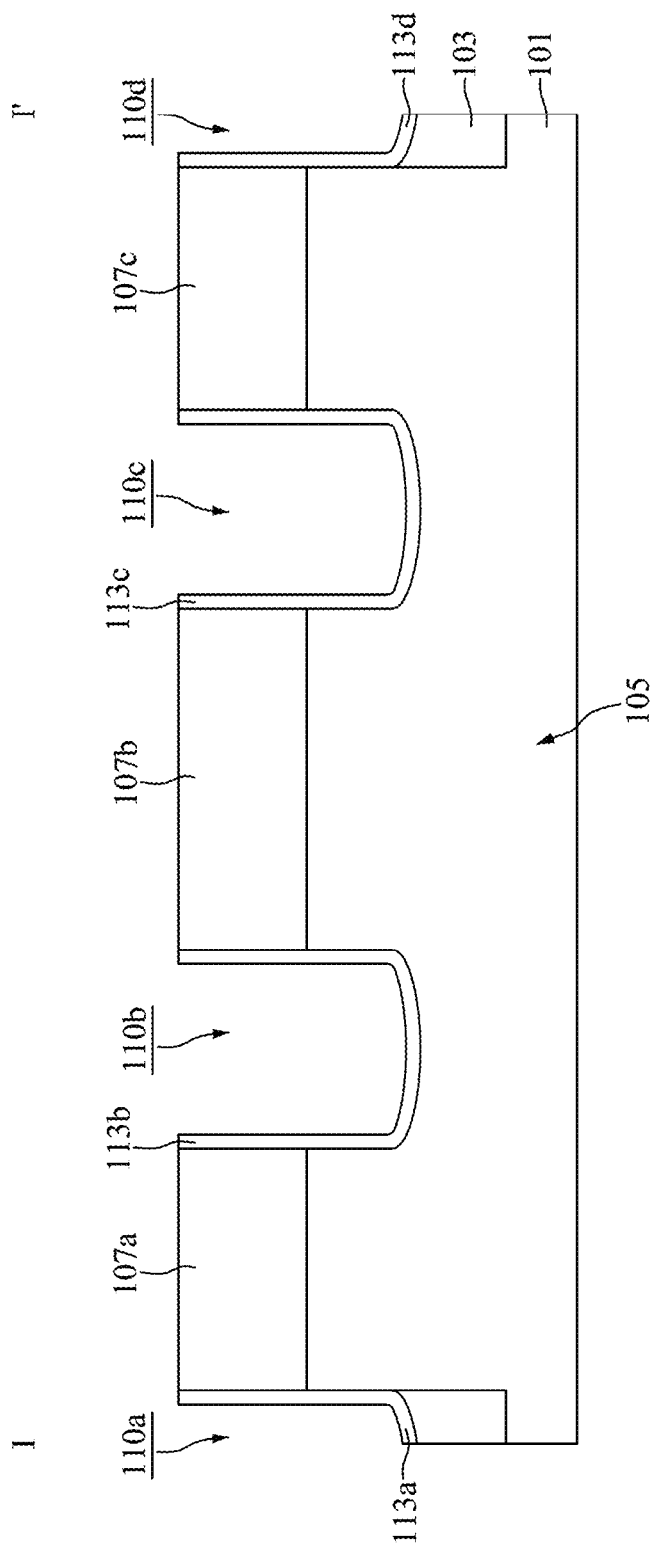
FIG. 12 is a cross-sectional view illustrating an intermediate stage of forming gate dielectric layers lining the trenches during the formation of the semiconductor device along the sectional line I-I' in FIG. 11, in accordance with some embodiments.

Next, the gate dielectric layers 113a, 113b, 113c, and 113d are formed lining the inner surfaces of the trenches 110a, 110b, 110c, and 110d, as shown in FIGS. 11 and 12 in accordance with some embodiments. The respective step is illustrated as the step S17 in the method 10 shown in FIG. 6. In some embodiments, the gate dielectric layers 113a, 113b, 113c, and 113d are made of silicon oxide, silicon nitride, silicon oxynitride, a dielectric material with high dielectric constant (high-k), or a combination thereof.

In addition, the formation of the gate dielectric layers 113a, 113b, 113c, and 113d may include conformally depositing a gate dielectric material (not shown) over the inner surfaces of the trenches 110a, 110b, 110c, and 110d and the top surface of the semiconductor substrate 101 (i.e., the top surfaces of the source/drain regions 107a, 107b, and 107c), and a planarization process is performed on the gate dielectric material to expose the semiconductor substrate 101. The deposition process of the gate dielectric material may include a chemical vapor deposition (CVD) process, a physical vapor deposition (PVD) process, an atomic layer deposition (ALD) process, a spin-coating process, or another applicable process. The planarization process of the gate dielectric material may be a chemical mechanical polishing (CMP) process.

Figure 13:
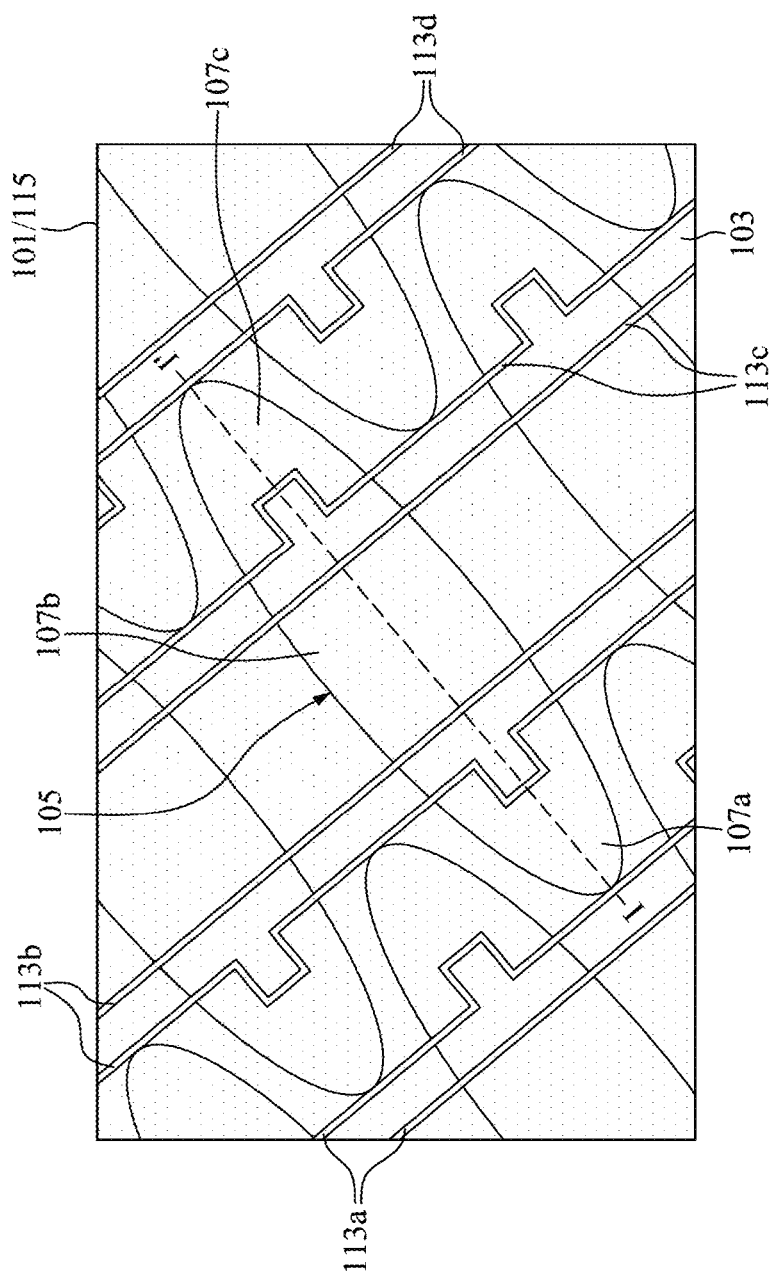
FIG. 13 is a top view illustrating an intermediate stage of filling the trenches with a gate electrode material during the formation of the semiconductor device, in accordance with some embodiments.
Figure 14:
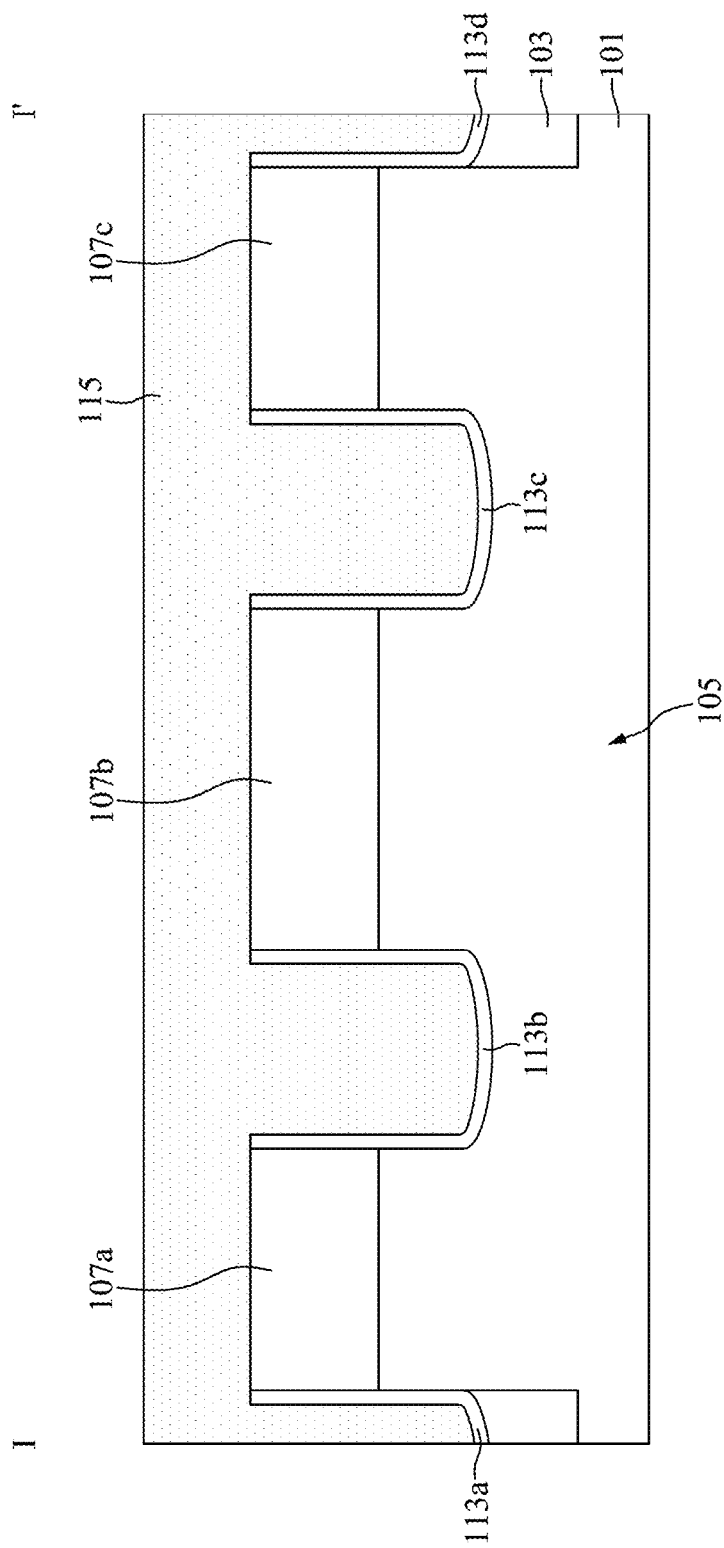
FIG. 14 is a cross-sectional view illustrating an intermediate stage of filling the trenches with a gate electrode material during the formation of the semiconductor device along the sectional line I-I' in FIG. 13, in accordance with some embodiments.

After the gate dielectric layers 113a, 113b, 113c, and 113d are formed, a gate electrode material 115 is formed in the trenches 110a, 110b, 110c and 110d and over the top surface of the semiconductor substrate 101, as shown in FIGS. 13 and 14 in accordance with some embodiments. The respective step is illustrated as the step S19 in the method 10 shown in FIG. 6. In some embodiments, a barrier layer (not shown) is formed between the gate dielectric layers 113a, 113b, 113c, and 113d and the gate electrode material 115.

Moreover, in some embodiments, the gate electrode material 115 is made of a conductive material such as aluminum (Al), copper (Cu), tungsten (W), titanium (Ti), tantalum (Ta), or another applicable material. In some embodiments, the gate electrode material 115 is formed by one or more deposition processes. The deposition process may include a CVD process, a PVD process, an ALD process, a plasma enhanced chemical vapor deposition (PECVD) process, a metal organic chemical vapor deposition (MOCVD) process, a plating process, a sputtering process or another applicable deposition process.

Figure 15:
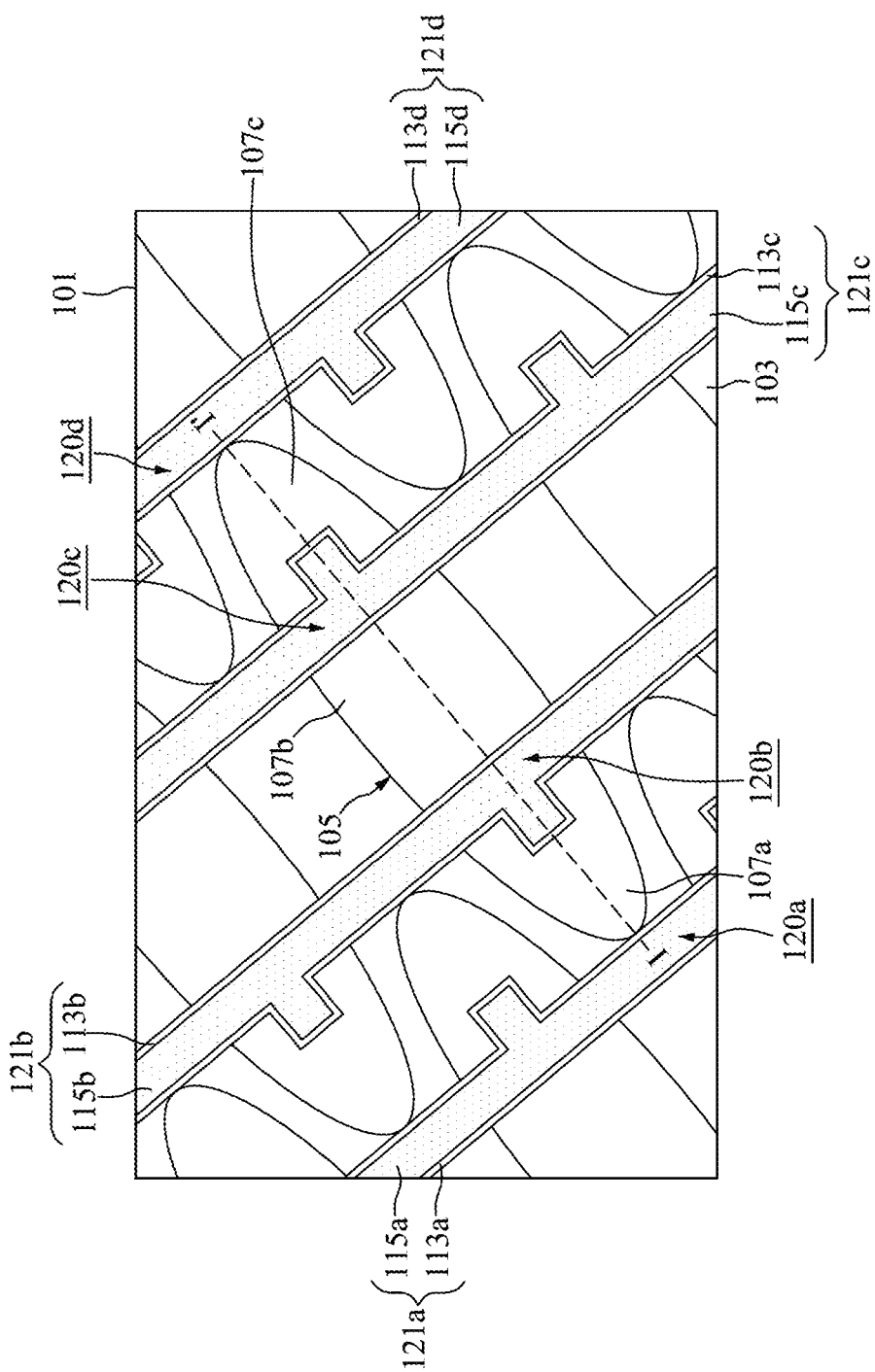
FIG. 15 is a top view illustrating an intermediate stage of recessing the gate electrode material to form gate structures during the formation of the semiconductor device, in accordance with some embodiments.
Figure 16:
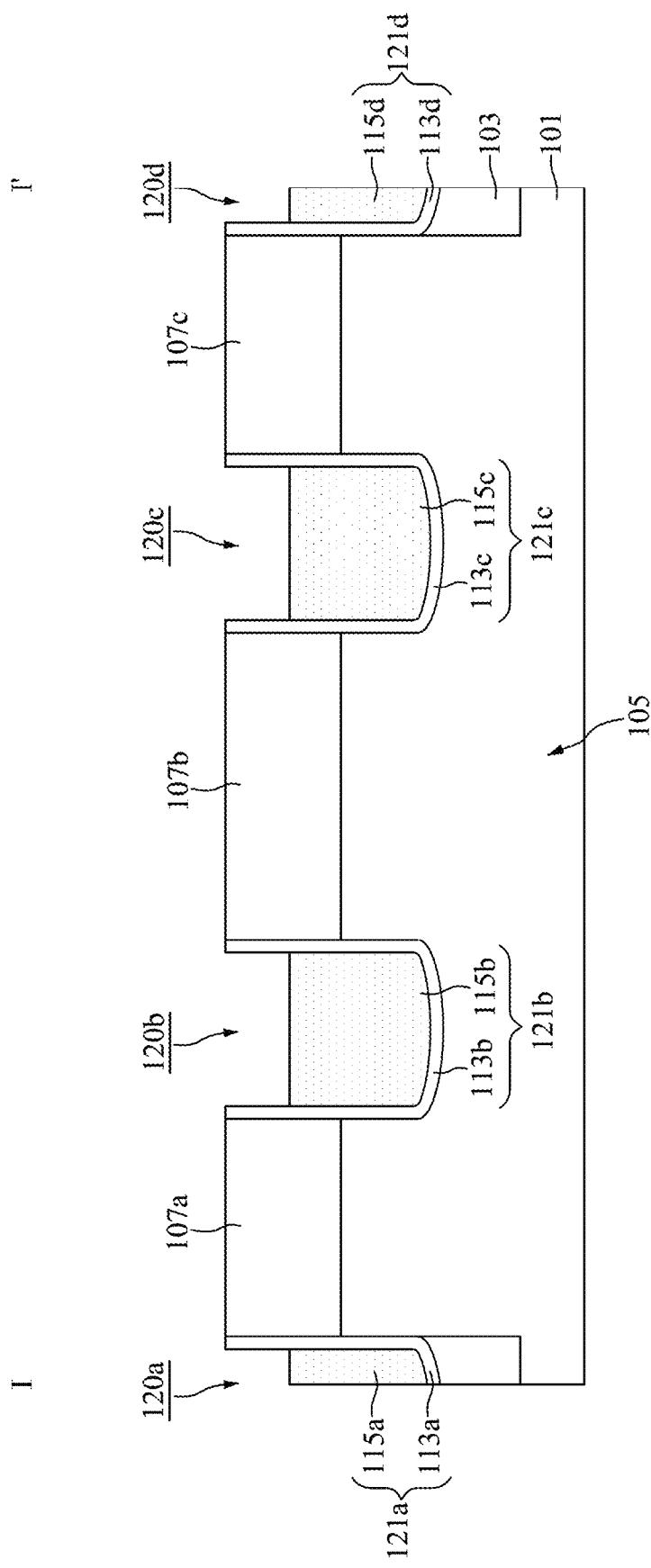
FIG. 16 is a cross-sectional view illustrating an intermediate stage of recessing the gate electrode material to form gate structures during the formation of the semiconductor device along the sectional line I-I' in FIG. 15, in accordance with some embodiments.

Subsequently, the gate electrode material 115 is recessed to form the gate structures 121a, 121b, 121c, and 121d in the trenches 110a, 110b, 110c, and 110d (see FIGS. 11 and 12), as shown in FIGS. 15 and 16 in accordance with some embodiments. The respective step is illustrated as the step S21 in the method 10 shown in FIG. 6. In some embodiments, the gate electrode material 115 is recessed through an etch-back process, such that gate electrodes 115a, 115b, 115c, and 115d are formed in the trenches 110a, 110b, 110c, and 110d. In some embodiments, the etch-back process includes a wet etching process, a dry etching process, or a combination thereof.

In some embodiments, the gate structure 121a includes the gate dielectric layer 113a and the gate electrode 115a, the gate structure 121b includes the gate dielectric layer 113b and the gate electrode 115b, the gate structure 121c includes the gate dielectric layer 113c and the gate electrode 115c, and the gate structure 121d includes the gate dielectric layer 113d and the gate electrode 115d. Moreover, recesses 120a, 120b, 120c, and 120d are obtained over the gate electrodes 115a, 115b, 115c, and 115d. In some embodiments, the gate dielectric layers 113a, 113b, 113c, and 113d are located at opposite sides of the recesses 120a, 120b, 120c, and 120d.

Figure 17:
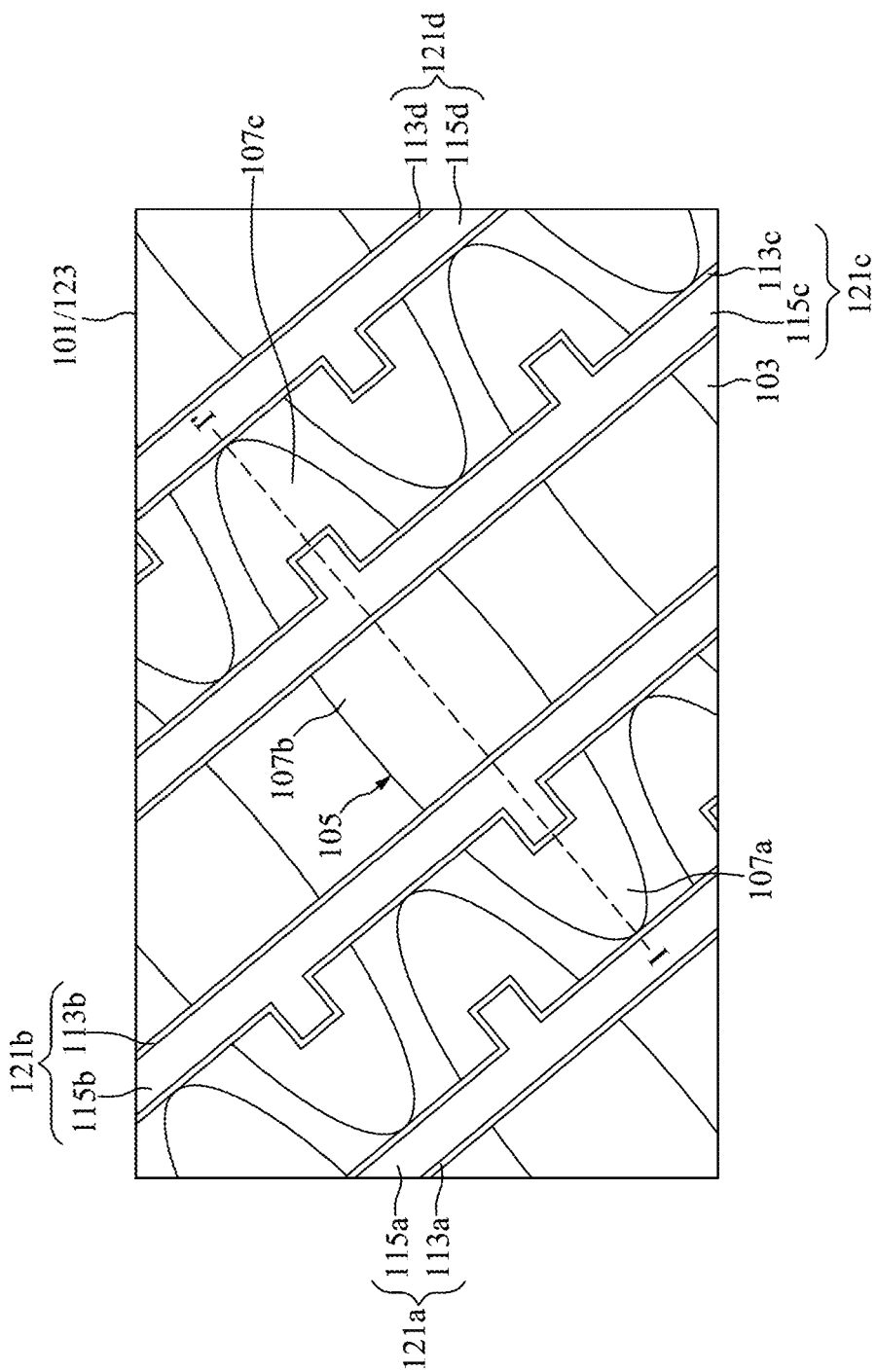
FIG. 17 is a top view illustrating an intermediate stage of forming a dielectric cap layer covering the gate structures during the formation of the semiconductor device, in accordance with some embodiments.
Figure 18:
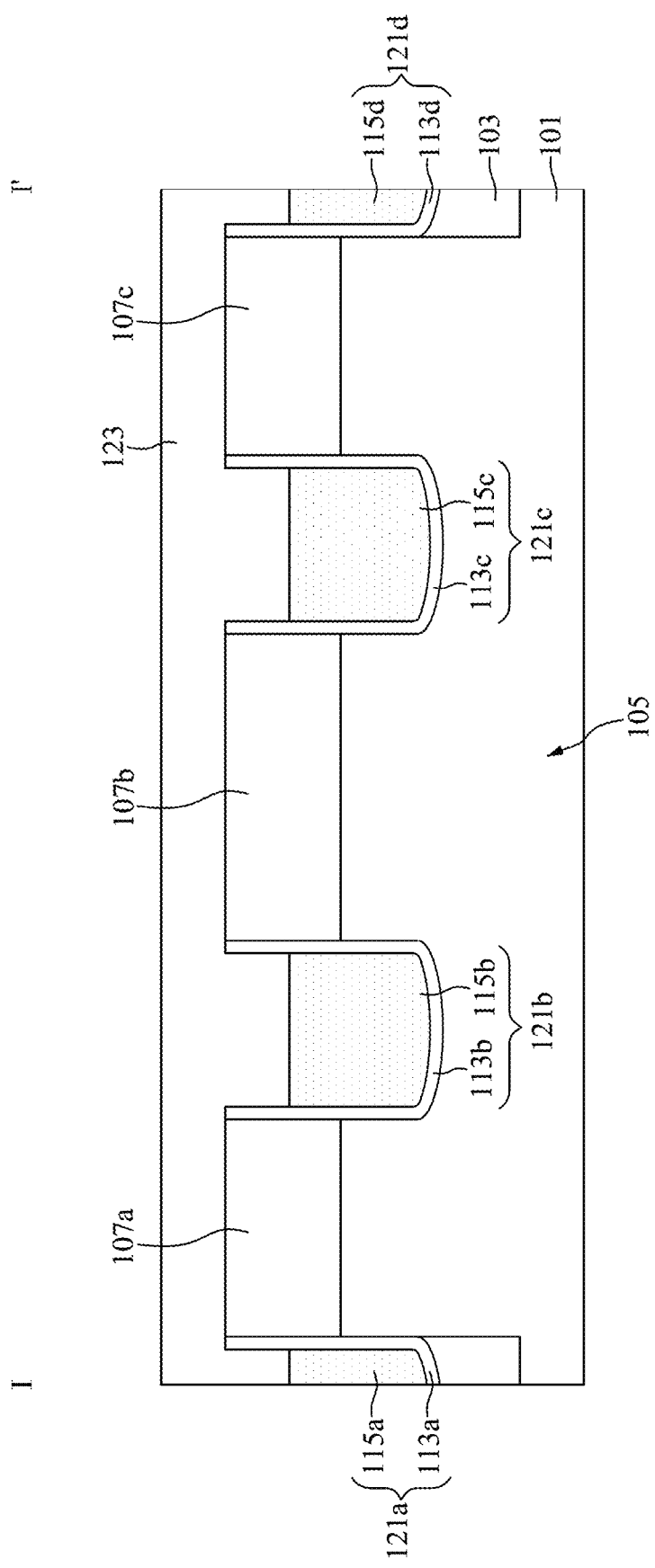
FIG. 18 is a cross-sectional view illustrating an intermediate stage of forming a dielectric cap layer covering the gate structures during the formation of the semiconductor device along the sectional line I-I' in FIG. 17, in accordance with some embodiments.

Next, a dielectric cap layer 123 is formed over the gate structures 121a, 121b, 121c, and 121d and covering the top surface of the semiconductor substrate 101, as shown in FIGS. 17 and 18 in accordance with some embodiments. The respective step is illustrated as the step S23 in the method 10 shown in FIG. 6. In some embodiments, the recesses 120a, 120b, 120c, and 120d (see FIGS. 15 and 16) are filled by the dielectric cap layer 123. In some embodiments, the dielectric cap layer 123 is made of silicon oxide, silicon nitride, silicon oxynitride, or another applicable dielectric material, and the dielectric cap layer 123 is formed by a CVD process, a PVD process, a spin coating process, another applicable process, or a combination thereof.

Figure 19:
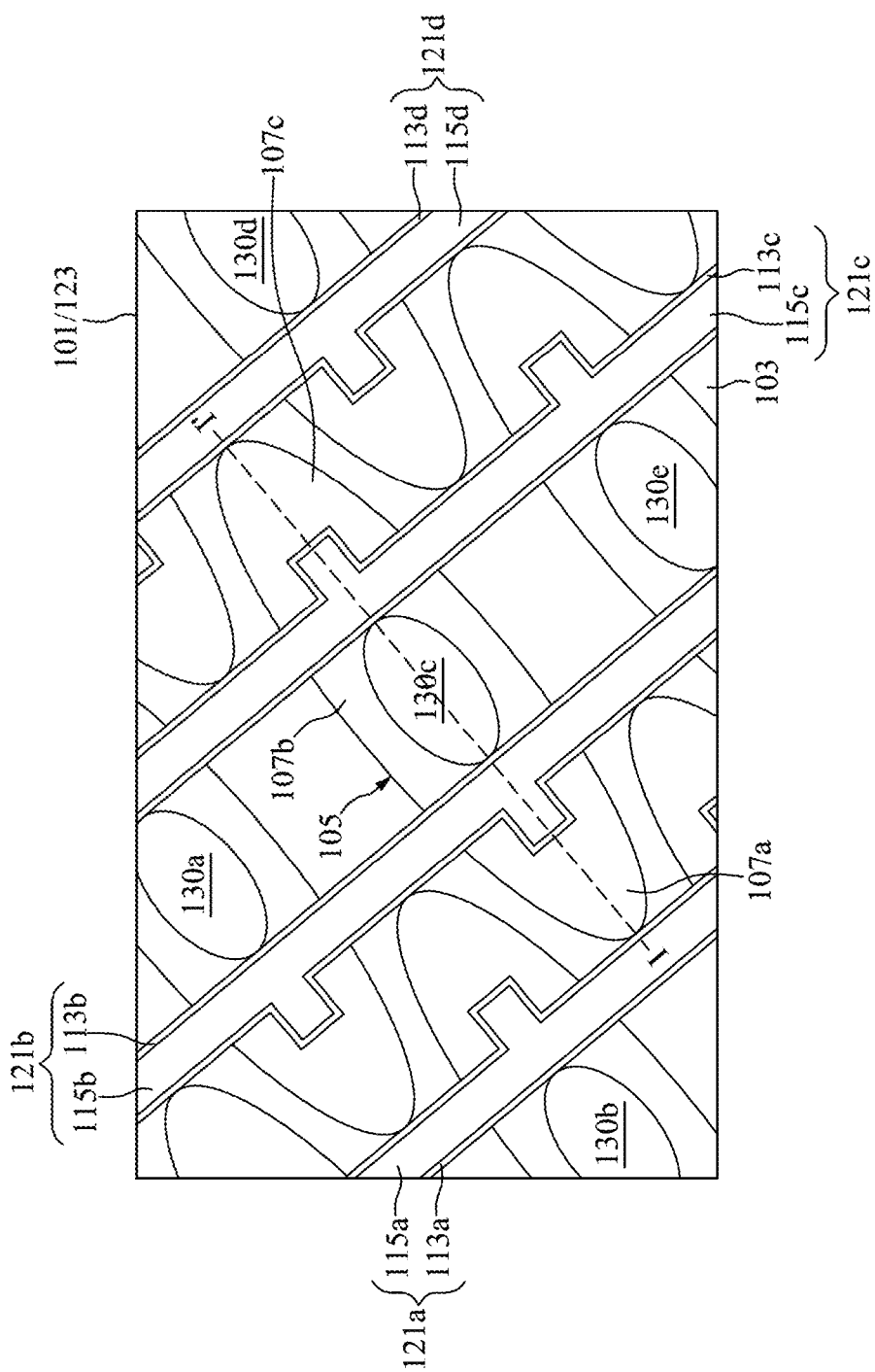
FIG. 19 is a top view illustrating an intermediate stage of removing a portion of the dielectric cap layer during the formation of the semiconductor device, in accordance with some embodiments.
Figure 20:
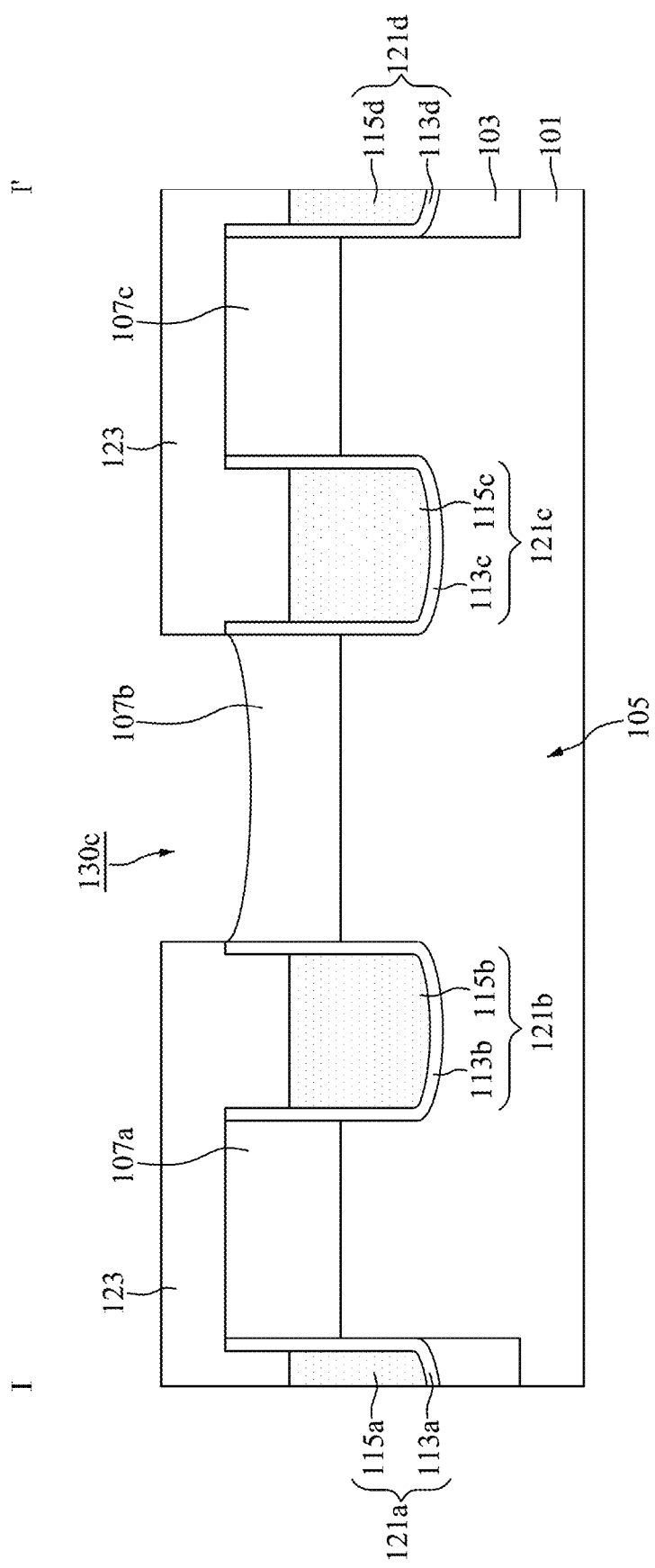
FIG. 20 is a cross-sectional view illustrating an intermediate stage of removing a portion of the dielectric cap layer during the formation of the semiconductor device along the sectional line I-I' in FIG. 19, in accordance with some embodiments.

Then, the dielectric cap layer 123 is partially removed to form openings 130a, 130b, 130c, 130d, and 130e between the gate structures 121a, 121b, 121c, and 121d, as shown in FIGS. 19 and 20 in accordance with some embodiments. In some embodiments, the openings 130a, 130b, 130c, 130d, and 130e are bit line openings which expose the source/drain regions between the gate structures extending across the same active region. For example, as shown in FIG. 20, the opening 130c exposes the source/drain region 107b between the gate structures 121b and 121c.

The formation of the openings 130a, 130b, 130c, 130d, and 130e may include forming a patterned mask (not shown) over the dielectric cap layer 123, and etching the dielectric cap layer 123 by using the patterned mask as a mask. In some embodiments, a portion of the source/drain regions (e.g., the source/drain region 107b) exposed by the patterned mask is removed by the etching process. After the openings 130a, 130b, 130c, 130d, and 130e are formed, the pattered mask may be removed.

After the openings 130a, 130b, 130c, 130d, and 130e are formed, the bit line structures 141a, 141b, and 141c are formed over the dielectric cap layer 123, as shown in FIGS. 1 and 2 in accordance with some embodiments. In some embodiments, the bit line structures 141a, 141b, and 141c are electrically connected to the source/drain regions between the gate structures extending across the same active region. The respective step is illustrated as the step S25 in the method 10 shown in FIG. 6.

Each of the bit line structures 141a, 141b, and 141c includes a lower bit line layer and an upper bit line layer. For example, as shown in FIG. 2, the bit line structure 141b includes a lower bit line layer 135b and an upper bit line layer 137b over the lower bit line layer 135b. Although FIG. 2 only shows one of the openings is filled by one of the lower bit line layers (i.e., the opening 130c of FIG. 20 is filled by the lower bit line layer 135b), it is understood that the other openings (e.g., the openings 130a, 130b, 130d, and 130e) may be filled by the other lower bit line layers.

The formation of the bit line structures 141a, 141b, and 141c may include forming a lower bit line material (not shown) over the dielectric cap layer 123 and filling the openings 130a, 130b, 130c, 130d, and 130e, forming an upper bit line material (not shown) over the lower bit line material, forming a patterned mask (not shown) over the upper bit line material, and etching the upper bit line material and the lower bit line material by using the patterned mask as a mask.

The bit line structures 141a, 141b, and 141c include the remaining portions of the lower bit line material and the remaining portions of the upper bit line material. In some embodiments, the remaining portions of the lower bit line layer material and the remaining portions of the upper bit line layer have aligned sidewalls. After the bit line structures 141a, 141b, and 141c are formed, the pattered mask may be removed.

In some embodiments, each of the lower bit line layers (e.g., the lower bit line layer 135b) may be a single layer including doped polysilicon, metal, metal silicide, or metal compound, or may be a multi-layer including any combination of the above materials. In addition, the lower bit line layers may be formed by a deposition process, such as a CVD process, a PVD process, an ALD process, a MOCVD process, a sputtering process, or another applicable process. In some embodiments, each of the upper bit line layers (e.g., the upper bit line layer 137b) includes multilayers. Moreover, the upper bit line layers may include a metal or a metal compound.

After the bit line structures 141a, 141b, and 141c are formed, the semiconductor device 100a is obtained. Some materials and processes used to form the semiconductor devices 100b and 100c are similar to, or the same as those used to form the semiconductor device 100a, and details thereof are not repeated herein.

Embodiments of the semiconductor devices 100a, 100b, and 100c are provided in the disclosure. The gate electrodes 115b and 115c of the semiconductor devices 100a, 100b, and 100c are disposed in the semiconductor substrate 101, and the source/drain regions 107a, 107b, and 107c are disposed in the active region 105 of the semiconductor substrate 101. The source/drain regions 107a and 107b are disposed at opposite sides of the gate electrode 115b, and the source/drain regions 107b and 107c are disposed at opposite sides of the gate electrode 115c.

In the semiconductor device 100a, the gate electrode 115b includes the portion 115b1 extending across the active region 105 and the portion 115b2 extending into the source/drain region 107a, and the gate electrode 115c includes the portion 115c1 extending across the active region 105 and the portion 115c2 extending into the source/drain region 107c. In the semiconductor device 100b, the gate electrode 115b includes the portion 115b1 extending across the active region 105 and the portion 115b3 extending into the source/drain region 107b, and the gate electrode 115c includes the portion 115c1 extending across the active region 105 and the portion 115c3 extending into the source/drain region 107b. In the semiconductor device 100c, the gate electrode 115b includes the portion 115b1 extending across the active region 105, the portion 115b2 extending into the source/drain region 107a, and the portion 115b3 extending into the source/drain region 107b, and the gate electrode 115c includes the portion 115c1 extending across the active region 105, the portion 115c2 extending into the source/drain region 107c, and the portion 115c3 extending into the source/drain region 107b. The gate electrodes 115b and 115c in these embodiments has "T" shapes in the top view.

By forming the T-shaped gate electrodes 115b and 115c in the semiconductor substrate 101, the effective gate width (i.e., effective channel width) may be increased, the saturation current may be increased. Thus, the gate control ability may be improved, and the operation speed of the device may be increased. Particularly, the charging and discharging rates of the transistors (e.g., the transistor composed of the gate electrode 115b and the source/drain regions 107a and 107b, and the transistor composed of the gate electrode 115c and the source/drain regions 107b and 107c) may be increased, and the write speeds of the capacitors coupled to the transistors may be improved, which significantly improves the overall device performance.

In one embodiment of the present disclosure, a semiconductor device is provided. The semiconductor device includes a semiconductor substrate having an active region, and a first gate electrode disposed in the semiconductor substrate. The semiconductor device also includes a first source/drain region and a second source/drain region disposed in the active region and at opposite sides of the first gate electrode. The first gate electrode has a first portion extending across the active region and a second portion extending into the first source/drain region.

In another embodiment of the present disclosure, a semiconductor device is provided. The semiconductor device includes an isolation structure disposed in a semiconductor substrate. The semiconductor device also includes a first source/drain region, a second source/drain region, and a third source/drain region disposed in an active region defined by the isolation structure. The semiconductor device further includes a first gate electrode disposed in the semiconductor substrate and between the first source/drain region and the second source/drain region. The first gate electrode has a first portion extending across the active region and a second portion protruding from the first portion. In addition, the semiconductor device includes a second gate electrode disposed in the semiconductor substrate and between the second source/drain region and the third source/drain region. The second gate electrode has a third portion extending across the active region and a fourth portion protruding from the third portion.

In yet another embodiment of the present disclosure, a method for forming a semiconductor device is provided. The method includes forming an isolation structure in a semiconductor substrate to define an active region, and forming a doped region in the active region. The method also includes etching the semiconductor substrate to form a first trench and a second trench. The first trench has a first portion extending across the doped region and a second portion extending away from the first portion, and the second trench has a third portion extending across the doped region and a fourth portion extending away from the third portion. The method further includes forming a first gate electrode in the first trench and a second gate electrode in the second trench.

The embodiments of the present disclosure have some advantageous features. By forming T-shaped gate electrode(s) in a semiconductor substrate, the gate control ability is improved, and the operation speed of the device is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a semiconductor substrate having an active region;
a first gate electrode disposed in the semiconductor substrate; and
a first source/drain region and a second source/drain region disposed in the active region and at opposite sides of the first gate electrode, wherein the first gate electrode includes a first sidewall and a second sidewall parallel to the first side wall, wherein the first gate electrode has a first portion extending across the active region and a second portion extending into the first source/drain region from the first sidewall of the first gate electrode, wherein the second portion does not extend into the second source/drain region from the second sidewall of the first gate electrode;

wherein the first source/drain region surrounds three sides of the second portion of the first gate electrode.

2. The semiconductor device of claim 1, wherein the second portion of the first gate electrode is within the active region.

3. The semiconductor device of claim 1, wherein the first portion and the second portion of the first gate electrode form a right angle.

4. The semiconductor device of claim 1, further comprising:
- a second gate electrode disposed in the semiconductor substrate; and
- a third source/drain region disposed in the active region, wherein the second source/drain region and the third source/drain region are disposed at opposite sides of the second gate electrode, wherein the second gate electrode includes a third sidewall and a fourth sidewall parallel to the third sidewall, and wherein the second gate electrode has a third portion extending across the active region and a fourth portion extending into the third source/drain region from the fourth sidewall of the second gate electrode, wherein the second portion does not extend into the second source/drain region from the third sidewall of the first gate electrode.

5. The semiconductor device of claim 4, wherein the second source/drain region is between the first gate electrode and the second gate electrode, and the second portion of the first gate electrode and the fourth portion of the second gate electrode extend parallel to each other.

6. The semiconductor device of claim 4, wherein the fourth portion of the second gate electrode is within the active region, and the third source/drain region surrounds three sides of the fourth portion of the second gate electrode.

7. The semiconductor device of claim 1, further comprising:
- a bit line structure disposed over the semiconductor substrate, wherein the bit line structure is electrically connected to the second source/drain region.

\* \* \* \* \*